US008198691B2

United States Patent
Tsujiuchi

(10) Patent No.: US 8,198,691 B2
(45) Date of Patent: Jun. 12, 2012

(54) SEMICONDUCTOR DEVICE HAVING MEMORY ELEMENT WITH STRESS INSULATING FILM

(75) Inventor: Mikio Tsujiuchi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/048,205

(22) Filed: Mar. 15, 2011

(65) Prior Publication Data

US 2011/0163401 A1 Jul. 7, 2011

Related U.S. Application Data

(62) Division of application No. 12/358,840, filed on Jan. 23, 2009, now Pat. No. 7,932,572.

(30) Foreign Application Priority Data

Feb. 15, 2008 (JP) ................................ 2008-034526

(51) Int. Cl.
*H01L 29/82* (2006.01)
*G11C 11/02* (2006.01)

(52) U.S. Cl. ......... 257/421; 257/E29.323; 257/E21.001; 438/3

(58) Field of Classification Search .................. 257/421, 257/E29.323, E21.001; 438/3
See application file for complete search history.

(56) References Cited

U.S. PATENT DOCUMENTS

| 6,714,444 | B2 | 3/2004 | Huai et al. |
| 7,215,566 | B2 | 5/2007 | Kanegae |
| 2005/0018365 | A1* | 1/2005 | Gill .......................... 360/324.11 |
| 2007/0108543 | A1 | 5/2007 | Furuta et al. |
| 2009/0209050 | A1* | 8/2009 | Wang et al. ....................... 438/3 |

FOREIGN PATENT DOCUMENTS

| JP | 2005-535125 | 11/2005 |
| JP | 2006-156608 | 6/2006 |
| JP | 2007-158301 | 6/2007 |

* cited by examiner

*Primary Examiner* — Jami M Valentine
(74) *Attorney, Agent, or Firm* — McDermott Will & Emery LLP

(57) ABSTRACT

Provided are a semiconductor device having an MTJ element capable of intentionally shifting the variation, at the time of manufacture, of a switching current of an MRAM memory element in one direction; and a manufacturing method of the device. The semiconductor device has a lower electrode having a horizontally-long rectangular planar shape; an MTJ element having a vertically-long oval planar shape formed on the right side of the lower electrode; and an MTJ's upper insulating film having a horizontally-long rectangular planar shape similar to that of the lower electrode and covering the MTJ element therewith. As the MTJ's upper insulating film, a compressive stress insulating film or a tensile stress insulating film for applying a compressive stress or a tensile stress to the MTJ element is employed.

8 Claims, 41 Drawing Sheets

_US 8,198,691 B2_

SEMICONDUCTOR DEVICE HAVING MEMORY ELEMENT WITH STRESS INSULATING FILM

CROSS-REFERENCE TO RELATED APPLICATIONS

This application is a Divisional of U.S. patent application Ser. No. 12/358,840, filed on Jan. 23, 2009 now U.S. Pat. No. 7,932,572, claiming priority of Japanese Patent Application No. 2008-034526, filed on Feb. 15, 2008, the entire contents of each of which are hereby incorporated by reference.

BACKGROUND OF THE INVENTION

The present invention relates to a semiconductor device having a memory element such as MTJ (Magnetic Tunnel Junction) element and a manufacturing method of the device.

MRAM is a memory which uses a magnetic material as its memory element and stores data, depending on the direction of magnetization of the magnetic material, in other words, a memory which retains data therein by storing information in the spin of electrons. The circuit of it is configured to allow random access. A memory element utilized as MRAM is, for example, an MTJ element. In this specification, the term "MTJ element" is used as a concept embracing a TMR (Tunneling Magneto Resistance) element.

Conventional MTJ elements (MTJ elements of a first kind) undergo a change in the resistance due to a magnetic field from the outside. Such typical MTJ elements (TMR elements) are disclosed, for example, in Japanese Unexamined Patent Publication No. 2006-156608.

Conventional MTJ elements (MTJ elements of a second kind) called "STT (Spin Torque Transfer)-RAM" undergo a change in the resistance by a current flowing through itself. Such MTJ elements called "STT-RAM" are disclosed, for example, in Japanese Unexamined Patent Application Publication (Translation of PCT Application) No. 2005-535125.

SUMMARY OF THE INVENTION

In the conventional MRAM memory elements, the switching current Isw which is a write current of the memory element is susceptible to the size of the memory element and the film thickness of a free layer (magnetic film). This means that as the element size is greater, the switching current Isw tends to be smaller, while as the free layer has a greater thickness, the switching current tends to be greater.

Owing to the above-described two factors (element size and thickness of free layer), the switching current Isw of the memory element varies at the time of manufacture and it becomes smaller or greater than the designed value.

For example, when the switching current Isw is unduly small, erroneous writing to a non-selected MTJ element occurs. It is therefore necessary to set the switching current Isw greater at the designing time in consideration of the variation at the time of manufacture.

The invention is made with a view to overcoming the above-described problem. An object of the invention is to provide a semiconductor device having an MTJ element capable of intentionally shifting the variation of a switching current Isw of an MRAM memory element at the time of manufacture in one direction; and a manufacturing method of the device.

A semiconductor device according to one embodiment of the invention is equipped with a stress insulating film that covers the surface and side surface of an MTJ element and applying a stress to the MTJ element.

In a first mode, this stress insulating film is a compressive stress insulating film that applies to the MTJ element a compressive stress enough to effectively influence on an increase/decrease of a switching current of the MTJ element.

In a second mode, this stress insulating film is a tensile stress insulating film that applies to the MTJ element a tensile stress.

Since in the above-described first and second modes, the switching current can be shifted intentionally in an increasing or decreasing direction by the compressive stress insulating film or tensile stress insulating film thus formed, these modes are effective for suppressing the variation in a decreasing or increasing direction of a switching current which occur at the time of manufacture.

DETAILED DESCRIPTION OF THE PREFERRED EMBODIMENTS

Technical Premise

Figure 58:
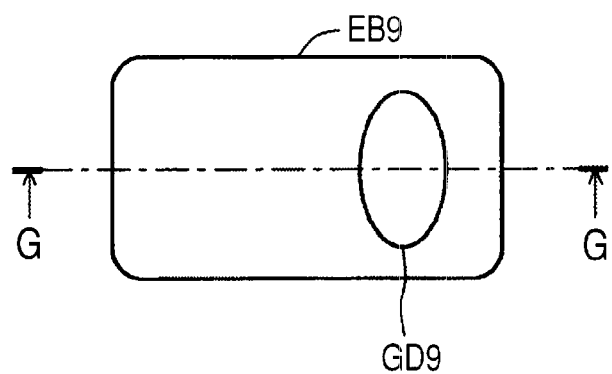
FIG. 58 is an explanatory view illustrating the planar schematic structure of a memory cell configuration of a typical MRAM as a technical premise of the invention.

FIG. 58 is an explanatory view illustrating the planar schematic structure of a memory cell configuration of a typical MRAM which is a technical premise of invention. As illustrated in this figure, an MTJ element MD9 having a vertically-long oval planar shape is formed on the right side of a lower electrode EB9 having a horizontally-long planar shape.

Figure 59:
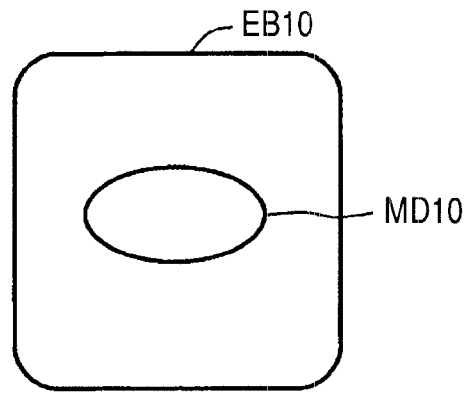
FIG. 59 is an explanatory view illustrating the planar schematic structure of an MTJ element called "STT-RAM"

FIG. 59 is an explanatory view illustrating the planar schematic structure of an MTJ element called "STT (Spin Torque Transfer)-RAM". As illustrated in this figure, an MTJ element MD10 having a horizontally-long oval planar shape is formed at the center of a lower electrode EB10 having a square planar shape.

Figure 60:
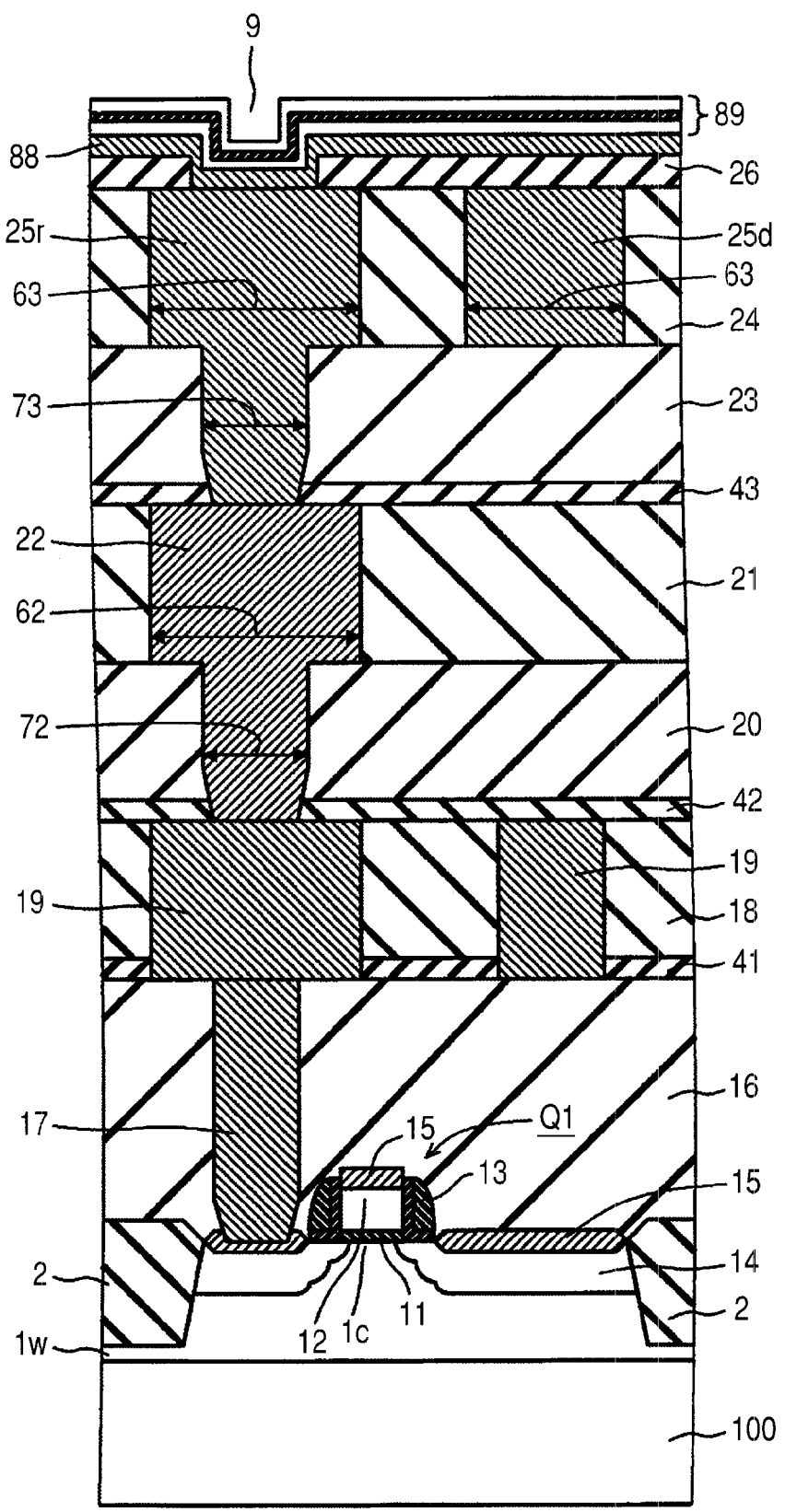
FIG. 60 is a cross-sectional view illustrating a portion of a manufacturing method of the typical MTJ element shown in FIG. 58.

FIGS. 60 to 64 are each a cross-sectional view illustrating a portion of a manufacturing method of a typical MTJ element illustrated in FIG. 58. FIGS. 60 to 64 are cross-sectional views taken along a line G-G of FIG. 58. First, a manufacturing process to obtain the structure of FIG. 60 is described.

An element isolation region 2 is formed selectively in an upper portion of a semiconductor substrate 100. The upper portion of the semiconductor substrate 100 between the element isolation regions 2 and 2 will be an active region in which a transistor and the like are formed.

A well region 1w is formed in the upper portion of the semiconductor substrate 100 by introducing a first conductivity type impurity.

Then, a gate insulating film 11 is formed over the well region 1w and a gate electrode 12 is formed selectively over the gate insulating film 11. The surface of the well region 1w below the gate electrode 12 is defined as a channel region 1c.

Then, after a second conductivity type (conductivity type opposite to the first conductivity type) impurity is introduced and diffused into the gate electrode 12 in self alignment, a sidewall 13 having a two-layer structure is formed on the side surface of the gate electrode 12. A second conductivity type impurity is introduced and diffused into the gate electrode 12 and the sidewall 13 in self alignment to form a pair of source/drain regions 14 and 14 having an extension region in the vicinity of the channel region 1c. As a result, a MOS transistor Q1 having the channel region 1c, the gate insulating film 11, the gate electrode 12, and the source/drain region 14 is formed.

A cobalt silicide region 15 is then formed over the surfaces of the source/drain regions 14 and 14 and the gate electrode 12.

An interlayer insulating film 16 is formed over the entire surface and a contact plug 17 penetrating through the interlayer insulating film 16 is selectively formed. This contact plug 17 is electrically coupled to the cobalt silicide region 15 of one of the source/drain regions 14 and 14.

A nitride film 41 and an interlayer insulating film (which is an oxide film) 18 are stacked on the entire surface and Cu interconnects 19 penetrating through the nitride film 41 and the interlayer insulating film 18 are selectively formed. As a result, a portion of the Cu interconnects 19 is electrically coupled to the contact plug 17. In such a manner, the Cu interconnects 19 forming a first-level metal interconnect are formed.

Then, a nitride film 42 and interlayer insulating films 20 and 21 (which are oxide films) are stacked over the entire surface. A minute hole 72 penetrating through the nitride film 42 and the interlayer insulating film 20 is selectively formed and moreover, an interconnection hole 62 penetrating through the interlayer insulating film 21 over a region including the minute hole 72 is selectively formed. Then, the minute hole 72 and the interconnection hole 62 are filled to form a Cu interconnect 22. The Cu interconnect 22 is electrically coupled to the Cu interconnect 19 (the Cu interconnect 19 to be electrically coupled to the contact plug 17). The Cu interconnect 22 forming a second-level metal interconnect is thus formed using the damascene technology.

A nitride film 43 and interlayer insulating films 23 and 24 (comprised of an oxide film) are formed over the entire surface. A minute hole 73 penetrating through the nitride film 43 and the interlayer insulating film 23 is selectively formed. Moreover, interconnection holes 63 penetrating through the interlayer insulating film 24 over a region including the minute hole 73 are selectively formed. Cu interconnects 25 (lead line 25r and digit line 25d) are formed to fill therewith the minute hole 73 and the interconnection hole 63. The lead line 25r is then electrically coupled to the Cu interconnect 22. The Cu interconnects 25 forming a third-level metal interconnect are thus formed using the damascene technology.

An interlayer insulating film 26 is then formed over the entire surface and a via hole 9 penetrating through a portion over a region of the lead line 25r in the memory cell portion is selectively formed.

The structure illustrated in FIG. 60 is then obtained by stacking a buried/interconnect metal layer 88 and an MTJ film 89 (including an upper electrode) over the entire surface. The buried/interconnect metal layer 88 and the upper electrode of the MTJ film 89 use, for example, Ta as a constituent material and they are formed, for example, by sputtering.

Figure 61:
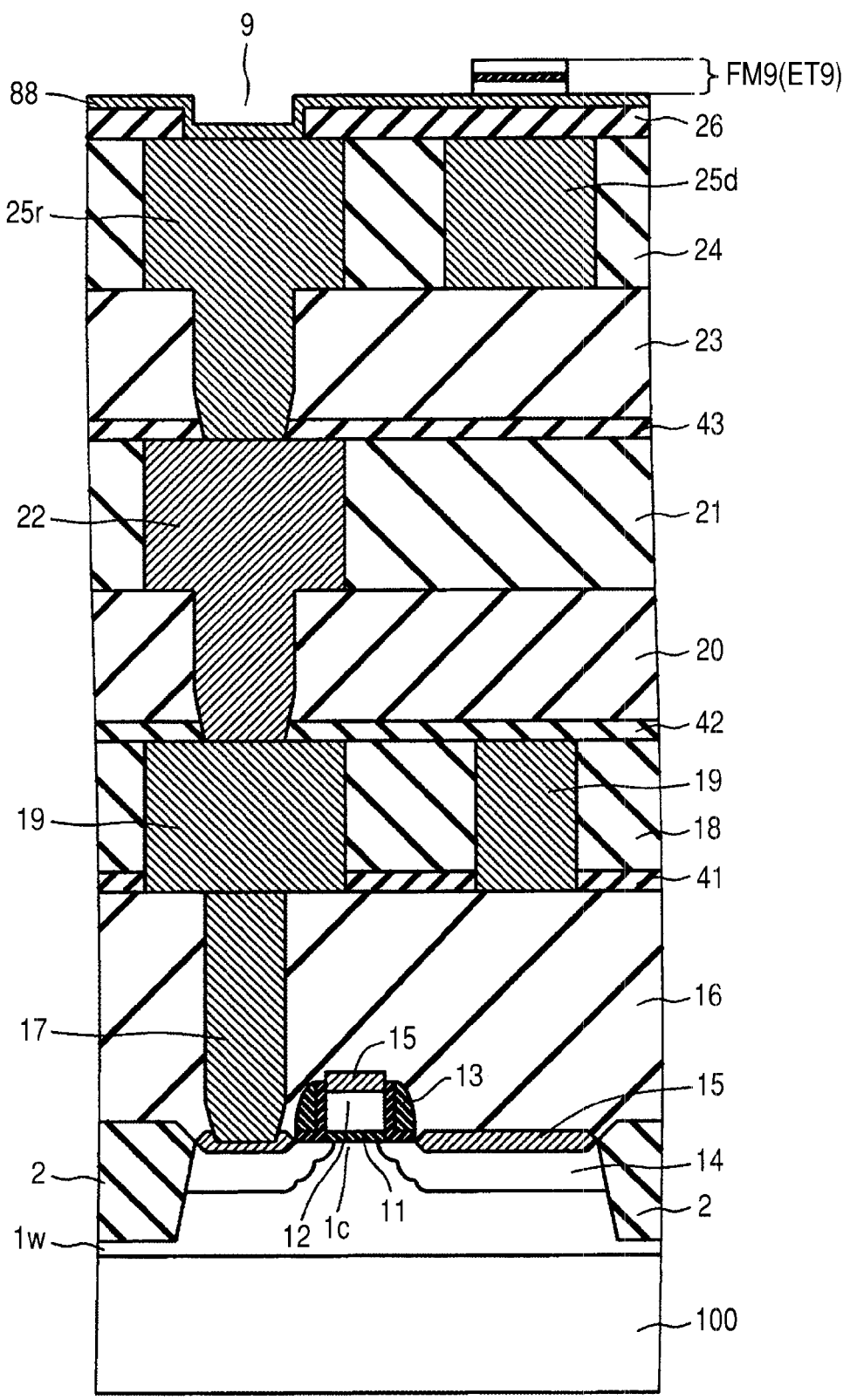
FIG. 61 is a cross-sectional view illustrating a portion of the manufacturing method of the typical MTJ element.

As illustrated in FIG. 61, by lithography using a patterned resist which is not illustrated in this figure, the MTJ film 89 is patterned to obtain a magnetic film FM9 (including upper electrode ET9).

Figure 62:
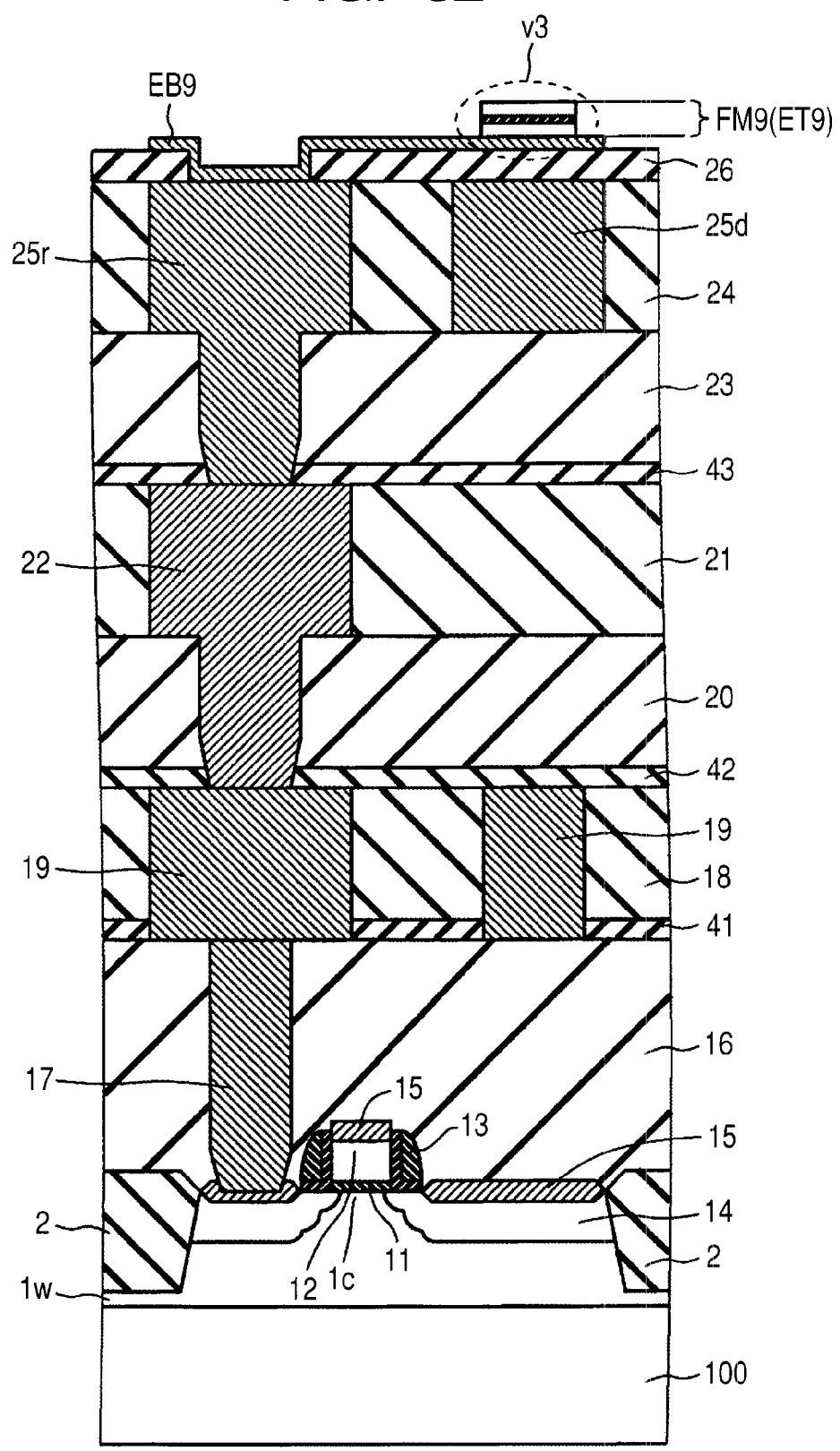
FIG. 62 is a cross-sectional view illustrating a portion of the manufacturing method of the typical MTJ element.

As illustrated in FIG. 62, with a patterned resist which is not illustrated in this figure, the buried/interconnect metal layer 88 is patterned to obtain a lower electrode EB9.

Figure 63:
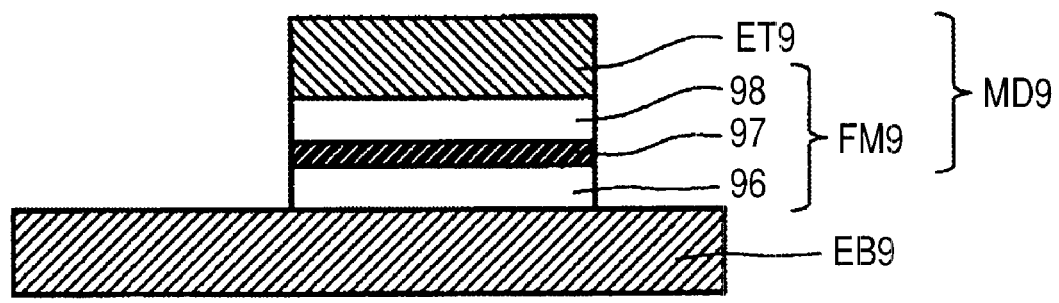
FIG. 63 is a cross-sectional view illustrating a portion of the manufacturing method of the typical MTJ element.

FIG. 63 is an explanatory view illustrating an enlarged structure of a region v3 of interest of FIG. 62. As illustrated in this figure, an MTJ element MD9 comprised of the magnetic film FM9 and the upper electrode ET9 can be obtained over the lower electrode EB9. More specifically, the magnetic film FM9 has a stack structure of a lower magnetic film 96, a tunnel insulating film 97, and an upper magnetic film 98.

Figure 64:
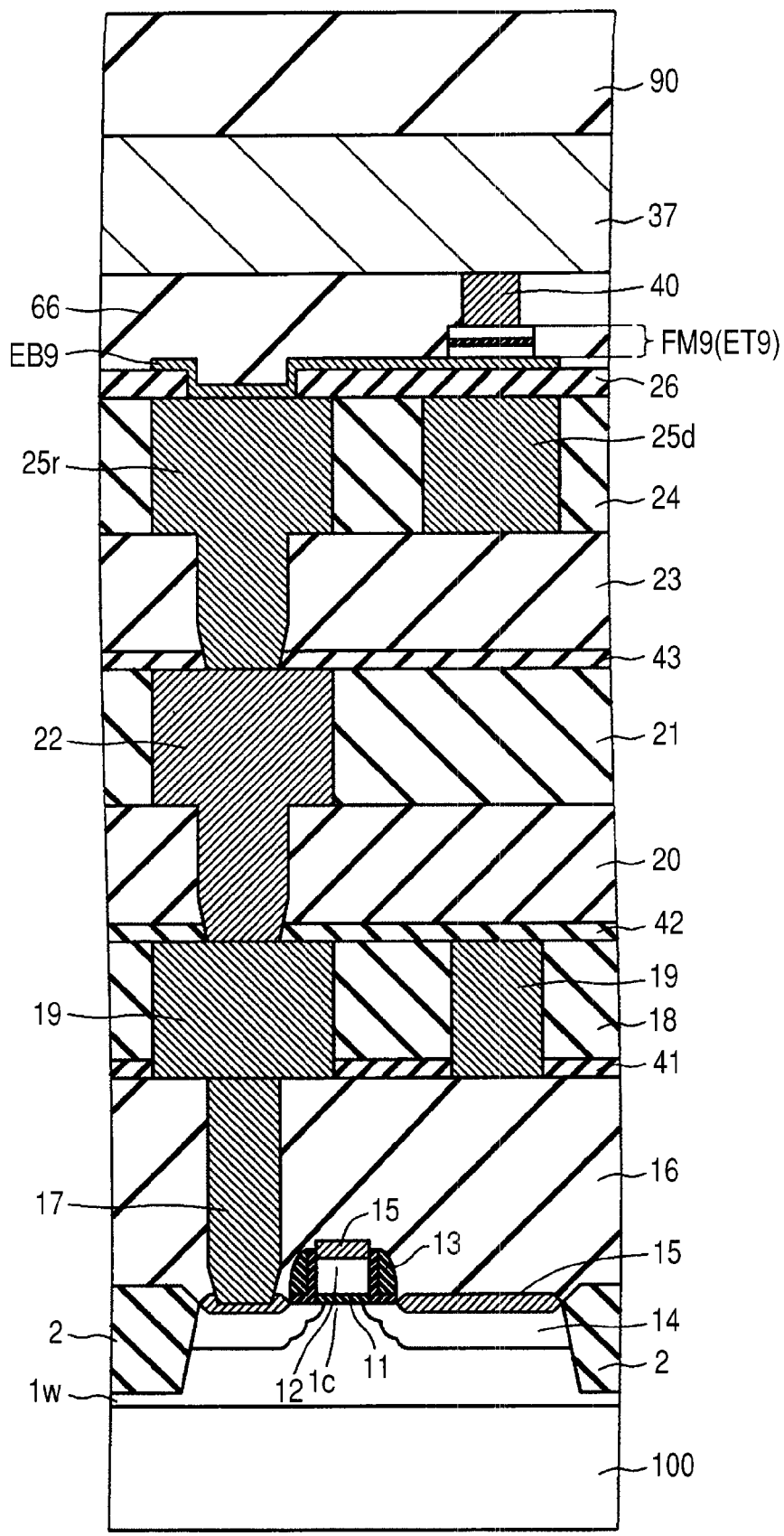
FIG. 64 is a cross-sectional view illustrating a portion of the manufacturing method of the typical MTJ element.

As illustrated in FIG. 64, an interlayer insulating film 66 made of $SiO_2$ is then formed over the entire surface, followed by CMP treatment of the interlayer insulating film 66 to planarize the interlayer insulating film 66. A via hole 40 penetrating through the interlayer insulating film 66 is then formed above the magnetic film FM9.

A bit line is obtained by simultaneously filling the via hole 40 with a Cu interconnect 37 and forming the Cu interconnect 37 over the interlayer insulating film 66. As a result, the Cu interconnect 37 is electrically coupled to the upper electrode ET9 of the MTJ element MD9 via the via hole 40. In such a manner, the Cu interconnect 37 forming a fourth-level metal interconnect is formed.

An interlayer insulating film 90 is formed finally over the entire surface, whereby a typical MRAM having the MTJ element MD1 and the lower electrode EB9 illustrated in FIG. 58 as a memory cell is completed.

EMBODIMENT 1

Principle

Figure 1:
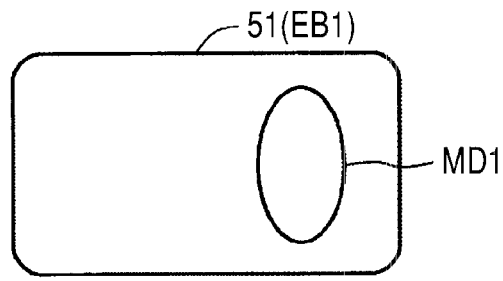
FIG. 1 is an explanatory view illustrating the planar schematic structure of a first memory cell configuration of an MRAM according to Embodiment 1 of the invention.

FIG. 1 is an explanatory view illustrating the planar schematic structure of a first memory cell configuration (a memory cell including a typical MTJ element) of an MRAM (semiconductor device) according to Embodiment 1 of the invention.

As illustrated in this figure, an MTJ element MD1 having a vertically-long oval planar shape is formed on the right side of a lower electrode EB1 having a horizontally-long rectangular planar shape. In addition, an upper insulating film 51 of MTJ (an upper insulating film of MTJ will hereinafter be called "MTJ's upper insulating film") which is a horizontally-long rectangular shape similar to that of the lower electrode EB1 is formed to cover the upper portion of the MTJ element MD1.

The term "horizontally-long planar shape" as used herein means that a ratio of a long side (upper or bottom side) to a short side (right or left side) exceeds "1", while the term "vertically-long planar shape" as used herein means that a ratio of a long side (right or left side) to a short side (upper or bottom side) exceeds "1". In the oval shape, the long side is a long axis and the short side is a short axis.

Figure 2:
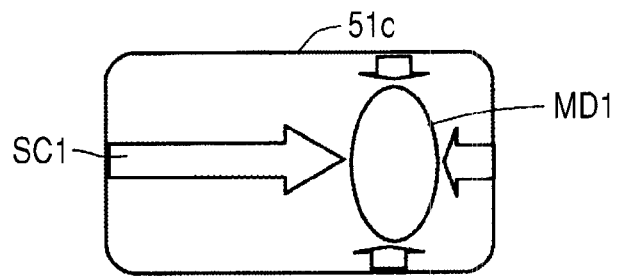
FIG. 2 is an explanatory view illustrating the planar schematic structure of the first mode in the first memory cell configuration according to Embodiment 1.

FIG. 2 is an explanatory view illustrating the planar schematic structure of the first mode in the first memory cell configuration according to Embodiment 1. As illustrated in this figure, a compressive stress insulating film 51c is formed while covering the MTJ's upper insulating film 51. The compressive stress insulating film 51c applies a compressive stress SC1 to the MTJ element MD1.

Figure 3:
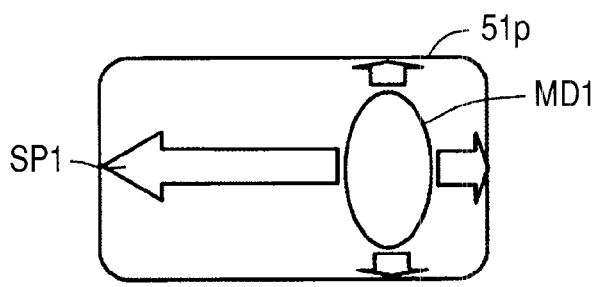
FIG. 3 is an explanatory view illustrating the planar schematic structure of the second mode in the first memory cell configuration according to Embodiment 1.

FIG. 3 is an explanatory view illustrating the planar schematic structure of the second mode in the first memory cell configuration according to Embodiment 1. As illustrated in this figure, the MTJ's upper insulating film 51 is formed as a tensile (tension) stress insulating film 51p. The tensile stress insulating film 51p applies a tensile stress SP1 to the MTJ element MD1.

Figure 4:
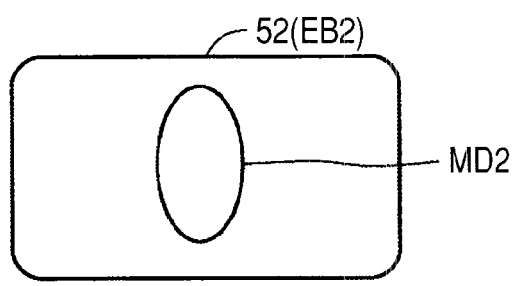
FIG. 4 is an explanatory view illustrating the planar schematic structure of a second memory cell configuration (STT-RAM) of the MRAM according to Embodiment 1 of the invention.

FIG. 4 is an explanatory view illustrating the planar schematic structure of a second memory cell configuration (STT-RAM) of the MRAM according to Embodiment 1 of the invention.

As illustrated in this figure, an MTJ element MD2 having a vertically-long oval planar shape is formed at the center of a lower electrode EB2 having a horizontally-long rectangular planar shape. The long axis direction of the MTJ element MD2 is set at an easy axis direction, while the short axis direction is set at a hard axis direction. In addition, an MTJ's upper insulating film 52 having a horizontally-long rectangular planar shape similar to that of the lower electrode EB2 is formed while covering the MTJ element MD2. The term "shape similar" means a shape formed by etching with the same mask as will be described later and it embraces a typical process variation.

Figure 5:
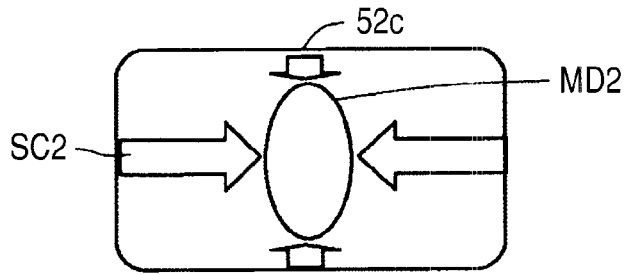
FIG. 5 is an explanatory view illustrating the planar schematic structure of the first mode in the second memory cell configuration according to Embodiment 1.

FIG. 5 is an explanatory view illustrating the planar schematic structure of the first mode in the second memory cell configuration according to Embodiment 1. As illustrated in this figure, the MTJ's upper insulating film 52 is formed as a compressive stress insulating film 52c. The compressive stress insulating film 52c applies a compressive stress SC2 to the MTJ element MD2.

Figure 6:
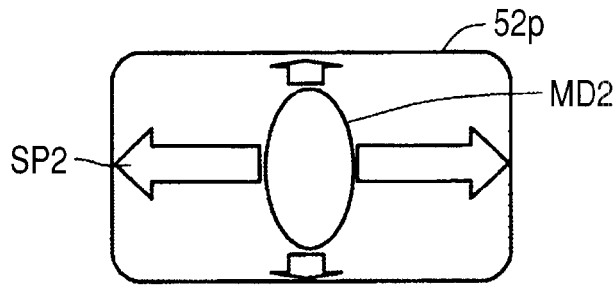
FIG. 6 is an explanatory view illustrating the planar schematic structure of the second mode in the second memory cell configuration according to Embodiment 1.

FIG. 6 is an explanatory view illustrating the planar schematic structure of the second mode in the second memory cell configuration according to Embodiment 1. As illustrated in this figure, the MTJ's upper insulating film 52 is formed as a tensile stress insulating film 52p. The tensile stress insulating film 52p applies a tensile stress SP2 to the MTJ element MD2.

As illustrated in FIGS. 2 and 5, since the MTJ's upper insulating film 51 (52) has a horizontally-long planar shape, the MTJ element MD1 (MD2) is subjected to a stronger compressive stress SC1 (SC2) in the short-side direction (short-axis direction) thereof. In the first mode, a compressive strain appears in the short side direction of the MTJ element MD1 (which strain may hereinafter be called "compressive-direction strain"). The term "short-side direction" as used herein means a direction parallel to the short side of the MTJ element MD1 or the MTJ's upper insulating film 51, while the term "long-side direction" means a direction parallel to the long side of the MTJ element MD1 or the MTJ's upper insulating film 51".

As illustrated in FIGS. 3 and 6, the MTJ's upper insulating film 51 (52) has a horizontally-long planar shape so that the MTJ element MD1 (MD2) is subjected to a stronger tensile stress SP1 (SP2) in the short-side direction thereof. In the second mode, a tensile strain therefore appears in the short-side direction of the MTJ element MD1 (which strain may hereinafter be called "tensile-direction strain").

Figure 7:
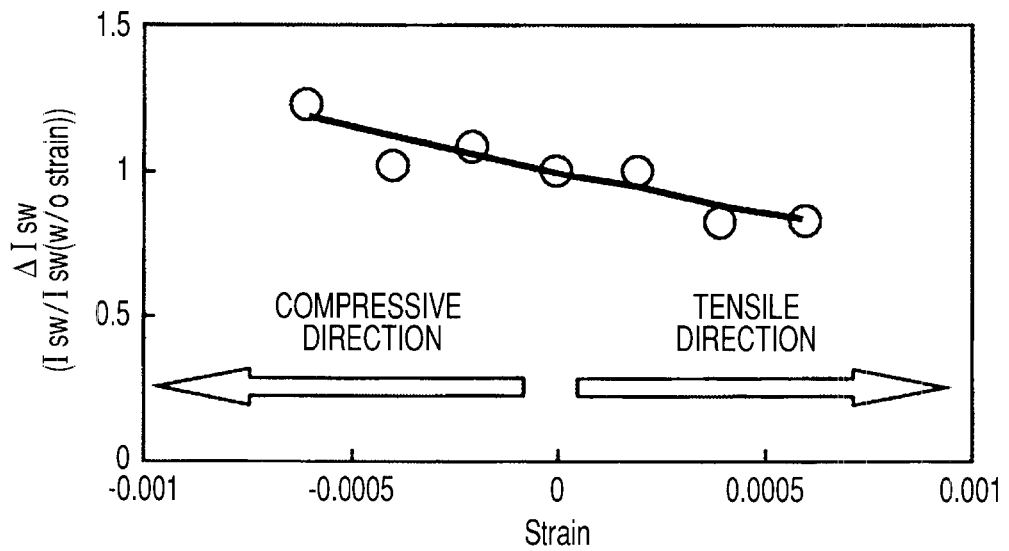
FIG. 7 is a graph showing the relationship between a strain to be applied to the short-side direction of an MTJ element in the MRAM of Embodiment 1 and an increase/decrease of a switching current.

FIG. 7 is a graph showing the relationship, in the MRAM of Embodiment 1, between a strain to be applied to the short-side direction of the MTJ element of the first memory cell configuration and an increase/decrease ΔIsw of the switching current Isw. The ΔIsw means a ratio of Isw (when the MTJ's upper insulating film 51 (52) is formed)/Isw (when the MTJ's upper insulating film 51 (52) is not formed (w/o strain)). The strain is determined from [strain ∈]=[stress σ]/[Young's modulus E (of magnetic film)].

As illustrated in this figure, there is a tendency that the greater the compressive-direction strain, the greater the switching current change rate ΔIsw in a positive direction, while the greater the tensile-direction strain, the greater the switching current change rate ΔIsw in a negative direction. This tendency also applies to the second memory cell configuration.

In the first and second memory cell configurations of the MRAM according to Embodiment 1, a uniaxial compressive stress can be efficiently applied to the short-side direction of the MTJ element MD1 by employing the first mode and aligning the long-side direction of the planar shape of the MTJ's upper insulating film 33 to the short side direction of the planar shape of the MTJ element MD1.

As a result, the switching current Isw can be raised intentionally by the formation of the MTJ's upper insulating film 33. In other words, the memory element of the MRAM according to Embodiment 1 can intentionally shift the variation of the switching current Isw at the time of manufacture in an increasing direction so that it is effective for suppressing a reduction in the switching current Isw due to the manufacturing process variation.

In the first and second memory cell configurations of the MRAM according to Embodiment 1, a uniaxial tensile stress can be effectively applied to the short-side direction of the MTJ element MD1 by employing the second mode and aligning the long-side direction of the planar shape of the MTJ's upper insulating film 33 to the short side direction of the planar shape of the MTJ element MD1.

As a result, the switching current Isw can be reduced intentionally. In other words, the memory element of the MRAM according to Embodiment 1 can shift the variation of the switching current Isw at the time of manufacture in a decreasing direction so that it is effective for suppressing an increase in the switching current Isw due to the variation of the manufacturing process variation.

The above-described effect appears both in the MTJ element MD1 which is an MTJ element of the first kind whose resistance varies, depending on the magnetic field which it receives from the outside and the MTJ element MD2 which is an MTJ element of the second kind whose resistance varies, depending on an electric current flowing through the element itself.

(Manufacturing Method (First Memory Cell Configuration))

Figure 8:
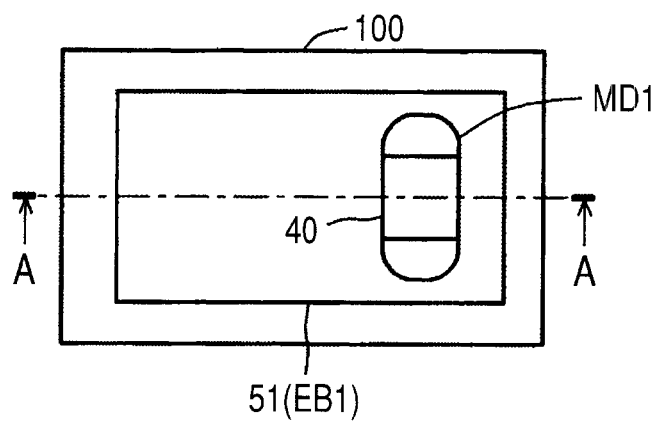
FIG. 8 is a plan view illustrating the planar structure in the first memory cell configuration according to Embodiment 1.

FIG. 8 is a plan view illustrating the planar structure in the first memory cell configuration according to Embodiment 1. As illustrated in this figure, a lower electrode EB1 having a horizontally-long rectangular planar shape is formed over the semiconductor substrate 100 and an MTJ element MD1 having a vertically-long oval planar shape is formed on the right side of the lower electrode EB1. In addition, an MTJ's upper insulating film 51 having a horizontally-long rectangular planar shape similar to that of the lower electrode EB1 is formed while covering therewith the MTJ element MD1. The MTJ element MD1 has, at the center thereof, a via hole 40.

FIGS. 9 to 28 are each a cross-sectional view illustrating the manufacturing method of the first memory cell configuration in the MRAM according to Embodiment 1. FIGS. 9 to 28 are cross-sectional views taken along a line A-A of FIG. 8. A manufacturing method of the MRAM according to Embodiment 1 will hereinafter be described referring to FIGS. 9 to 28.

Figure 9:
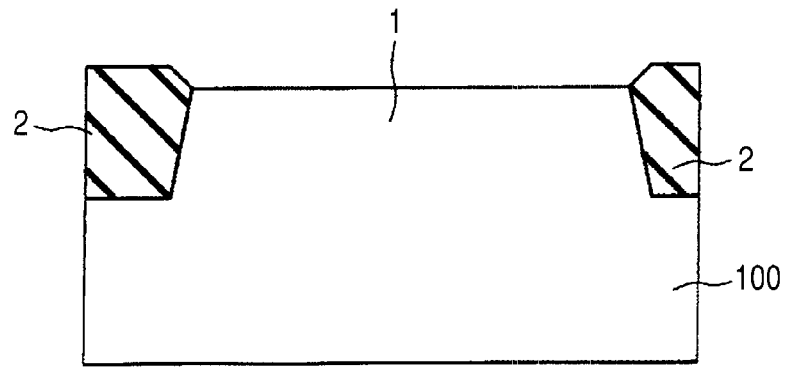
FIG. 9 is a cross-sectional view illustrating a manufacturing method of the first memory cell configuration in the MRAM of Embodiment 1.

First as illustrated in FIG. 9, an element isolation region 2 is formed selectively in the upper portion of a semiconductor substrate 100. The upper portion of the semiconductor substrate 100 between the element isolation regions 2 and 2 will be an active region 1 in which a transistor and the like are formed.

Figure 10:
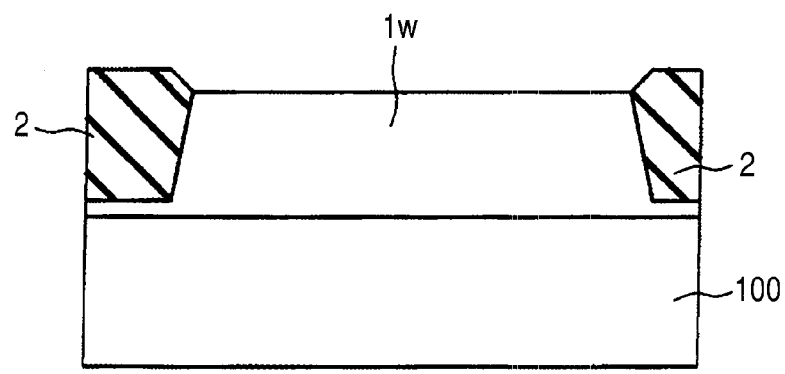
FIG. 10 is a cross-sectional view illustrating the manufacturing method of the first memory cell configuration in the MRAM of Embodiment 1.

As illustrated in FIG. 10, a well 1W is then formed in the upper portion of the semiconductor substrate 100 by introducing a first conductivity type impurity.

Figure 11:
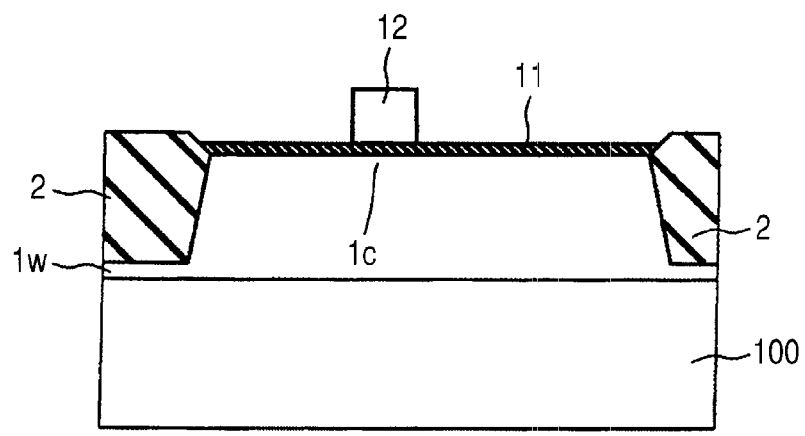
FIG. 11 is a cross-sectional view illustrating the manufacturing method of the first memory cell configuration in the MRAM of Embodiment 1.

As illustrated in FIG. 11, a gate insulating film 11 is then formed over the well region 1w and a gate electrode 12 is formed selectively over the gate insulating film 11. The surface of the well region 1W below the gate electrode 12 is defined as a channel region 1c.

Figure 12:
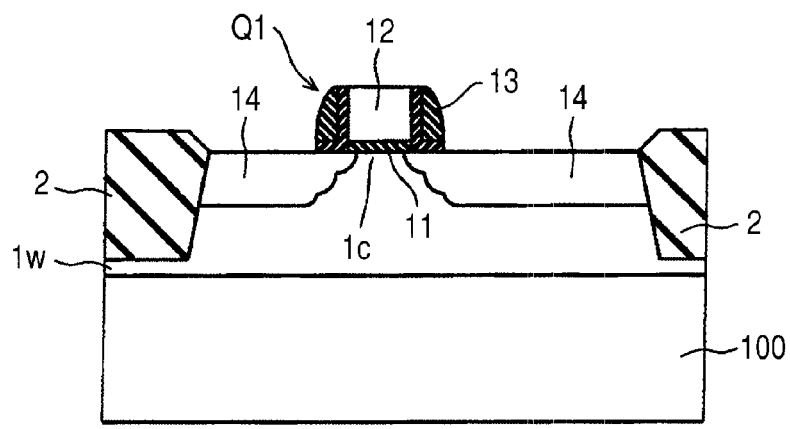
FIG. 12 is a cross-sectional view illustrating the manufacturing method of the first memory cell configuration in the MRAM of Embodiment 1.

As illustrated in FIG. 12, after injection and diffusion of a second conductivity type (conductivity type opposite to the first conductivity type) impurity into the gate electrode 12 in self alignment, a sidewall 13 having a two-layer structure is formed on the side surface of the gate electrode 12. Then, a second conductivity type impurity is injected and diffused into the gate electrode 12 and the sidewall 13 in self alignment to form a pair of source/drain regions 14 and 14 having an extension region in the vicinity of the channel region 1c. As a result, an MOS transistor Q1 having the channel region 1c, the gate insulating film 11, the gate electrode 12, and the source/drain region 14 is formed.

Figure 13:
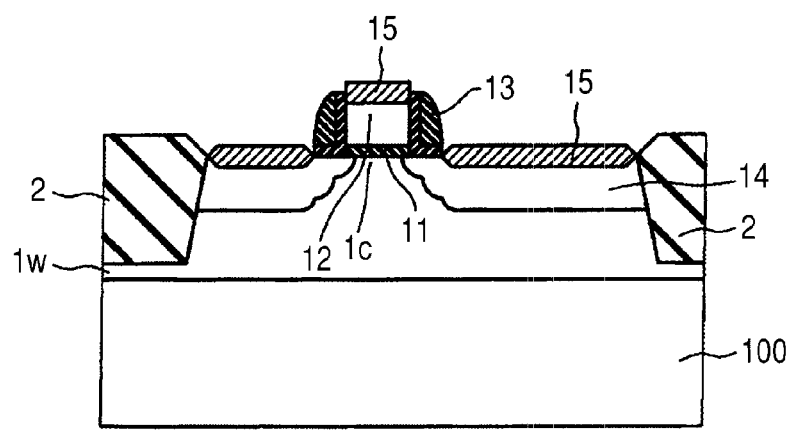
FIG. 13 is a cross-sectional view illustrating the manufacturing method of the first memory cell configuration in the MRAM of Embodiment 1.

As illustrated in FIG. 13, a cobalt silicide region 15 is then formed over the surface of each of the source/drain regions 14 and 14, and the gate electrode 12.

Figure 14:
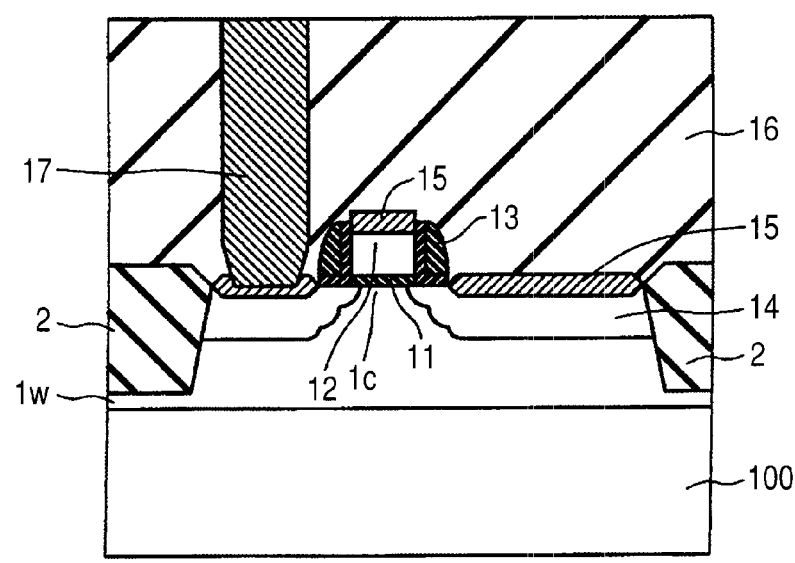
FIG. 14 is a cross-sectional view illustrating the manufacturing method of the first memory cell configuration in the MRAM of Embodiment 1.

Then, as illustrated in FIG. 14, an interlayer insulating film 16 is formed over the entire surface and a contact plug 17 penetrating through the interlayer insulating film 16 is selectively formed. This contact plug 17 is electrically coupled to the cobalt silicide region 15 of one of the source/drain regions 14 and 14.

Figure 15:
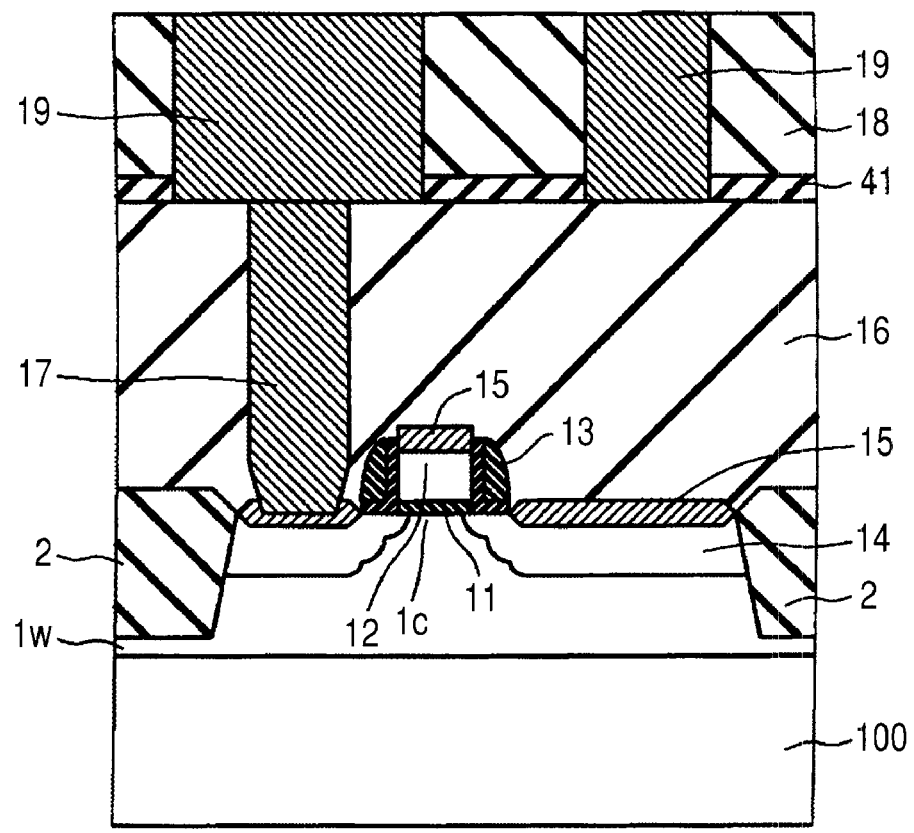
FIG. 15 is a cross-sectional view illustrating the manufacturing method of the first memory cell configuration in the MRAM of Embodiment 1.

As illustrated in FIG. 15, a nitride film 41 and an interlayer insulating film 18 (which is an oxide film) are stacked and Cu interconnects 19 penetrating through the nitride film 41 and the interlayer insulating film 18 are selectively formed. As a result, a portion of the Cu interconnects 19 is electrically coupled to the contact plug 17. In such a manner, the Cu interconnects 19 forming a first-level metal interconnect are formed.

Figure 16:
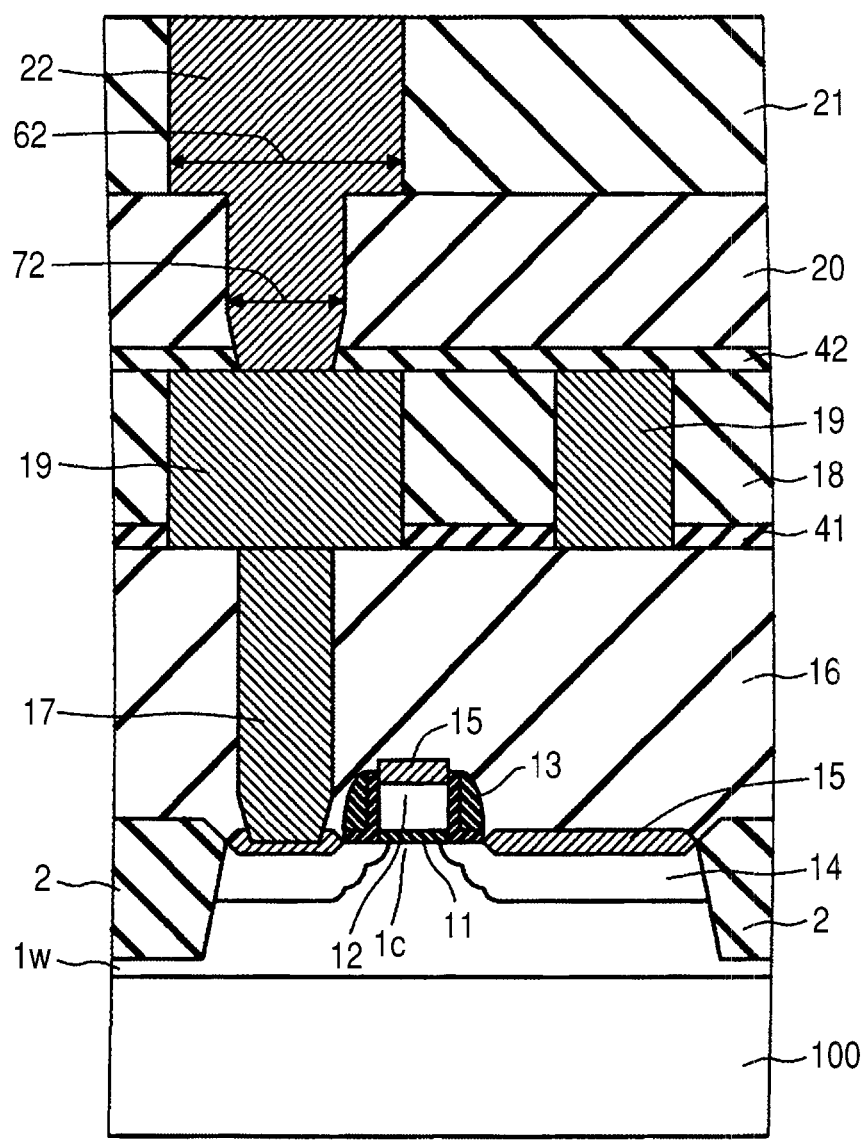
FIG. 16 is a cross-sectional view illustrating the manufacturing method of the first memory cell configuration in the MRAM of Embodiment 1.

As illustrated in FIG. 16, a nitride film 42 and interlayer insulating films 20 and 21 (which are oxide films) are stacked over the entire surface and a minute hole 72 penetrating through the nitride film 42 and the interlayer insulating film 20 is selectively formed. An interconnection hole 62 penetrating through the interlayer insulating film 21 over a region including the minute hole 72 is selectively formed. A Cu interconnect 22 is then formed by filling the minute hole 72 and the interconnection hole 62 therewith. The Cu interconnect 22 is electrically coupled to the Cu interconnect 19 (the Cu interconnect 19 electrically coupled to the contact plug 17). In such a manner, the Cu interconnect 22 forming a second-level metal interconnect is formed by the damascene technology.

Figure 17:
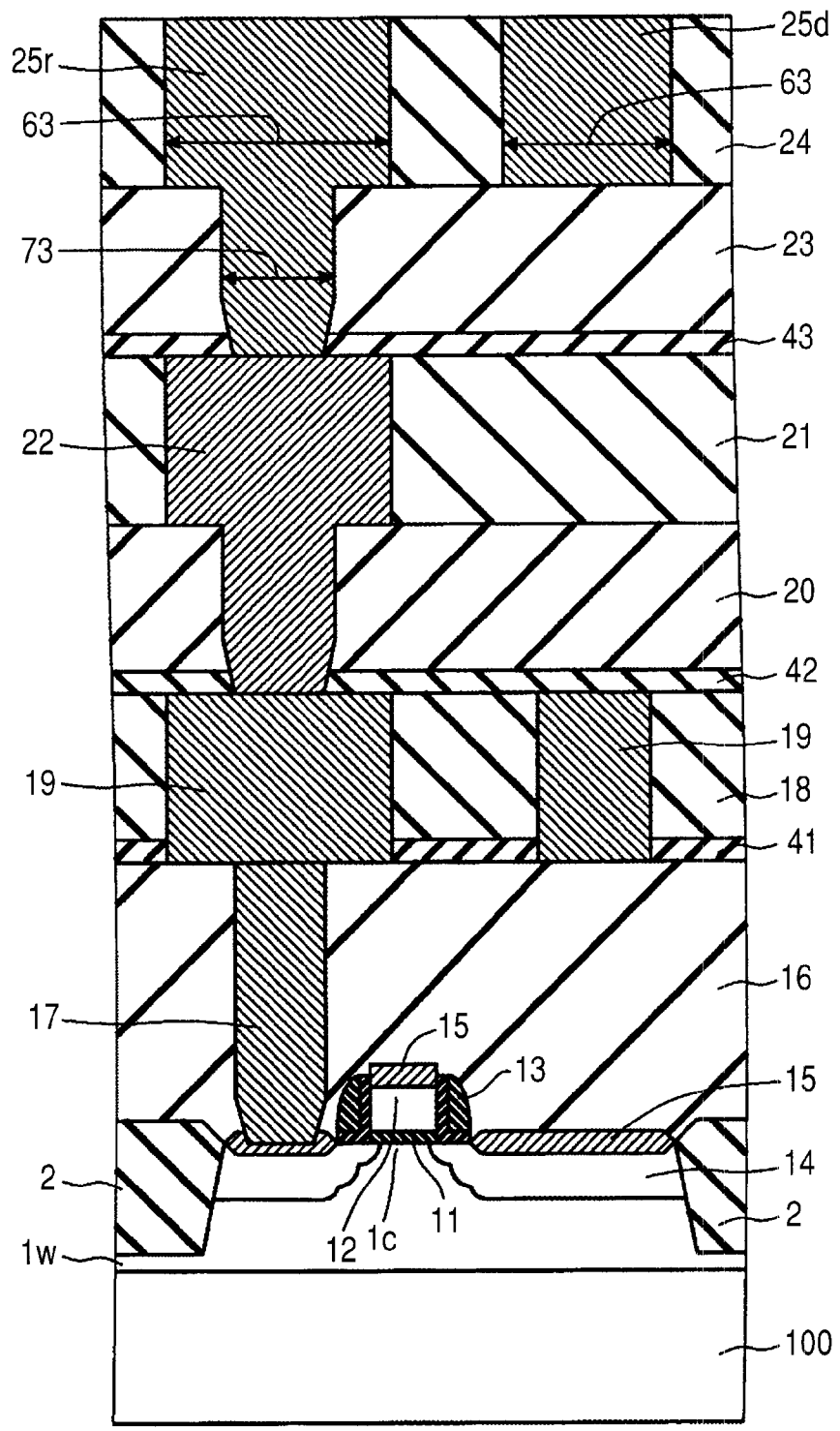
FIG. 17 is a cross-sectional view illustrating the manufacturing method of the first memory cell configuration in the MRAM of Embodiment 1.

As illustrated in FIG. 17, a nitride film 43 and interlayer insulating films 23 and 24 (which are oxide films) are then formed over the entire surface and a minute hole 73 penetrating through the nitride film 43 and the interlayer insulating film 23 is selectively formed. An interconnection hole 63 penetrating through the interlayer insulating film 24 over a region including the minute hole 73 is then selectively formed. Cu interconnects 25 (lead line 25r, digit line 25d) are then formed while filling the minute hole 73 and the interconnection hole 63 therewith. The lead line 25r is electrically coupled to the Cu interconnect 22. In such a manner, the Cu interconnects 25 forming a third-level metal interconnect are formed by the damascene technology.

Figure 18:
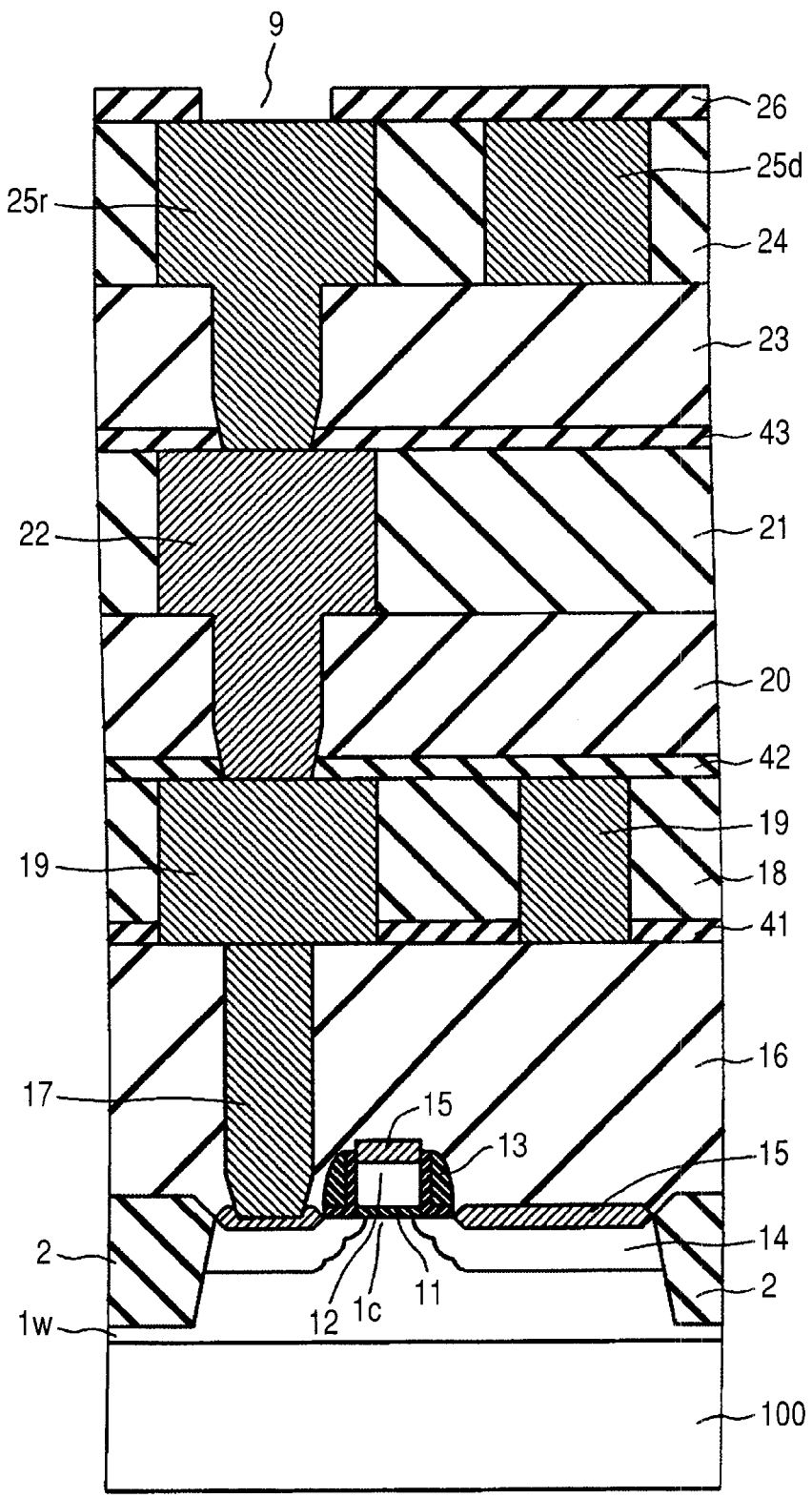
FIG. 18 is a cross-sectional view illustrating the manufacturing method of the first memory cell configuration in the MRAM of Embodiment 1.

As illustrated in FIG. 18, an interlayer insulating film 26 is then formed over the entire surface and a via hole 9 penetrating through a portion of the interlayer insulating film over a region of the lead line 25r in the memory cell portion is selectively formed.

Figure 19:
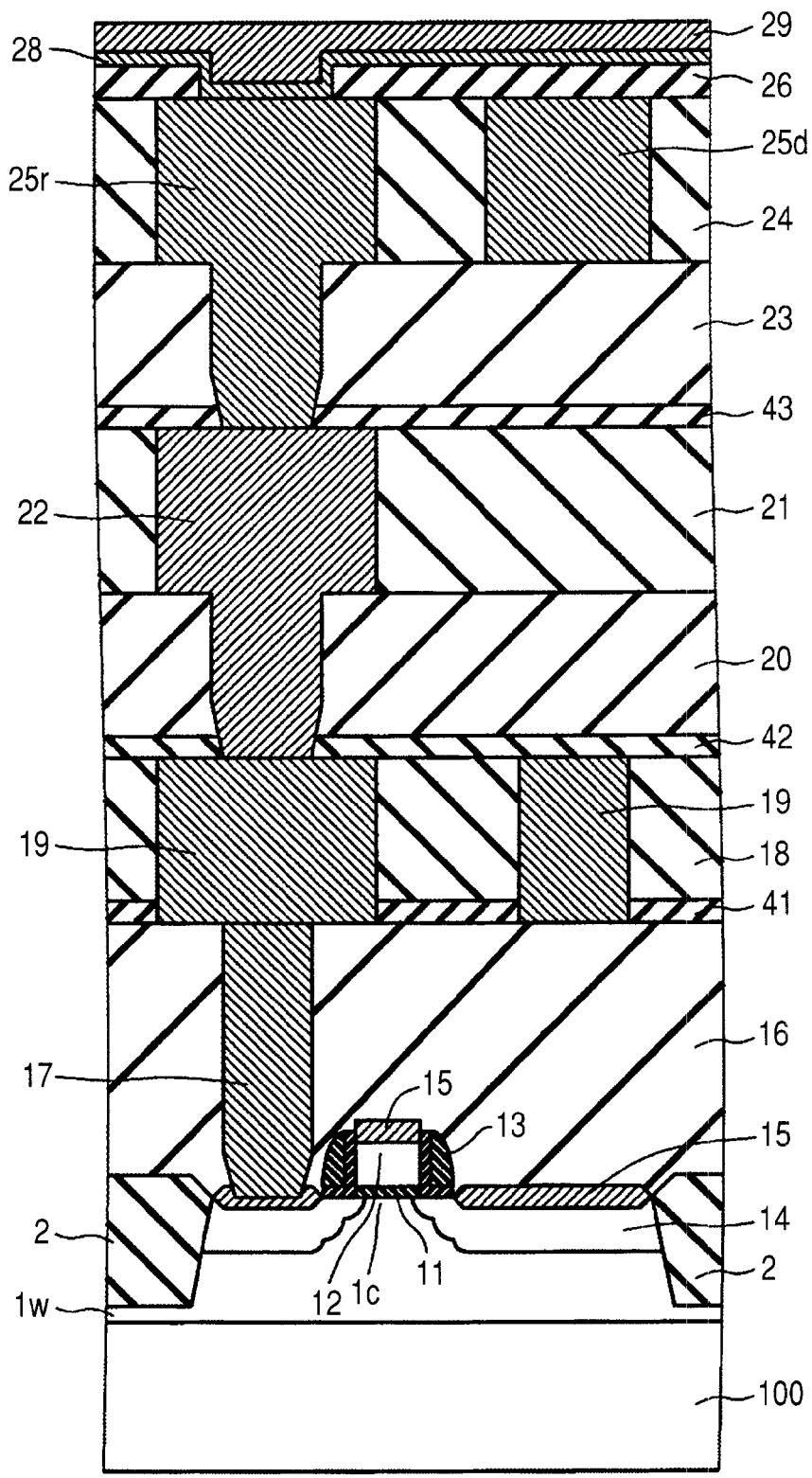
FIG. 19 is a cross-sectional view illustrating the manufacturing method of the first memory cell configuration in the MRAM of Embodiment 1.

As illustrated in FIG. 19, a barrier metal layer 28 is then formed over the entire surface including the inside of the via hole 9 and a via-burying metal layer 29 is formed over the barrier metal layer 28.

Figure 20:
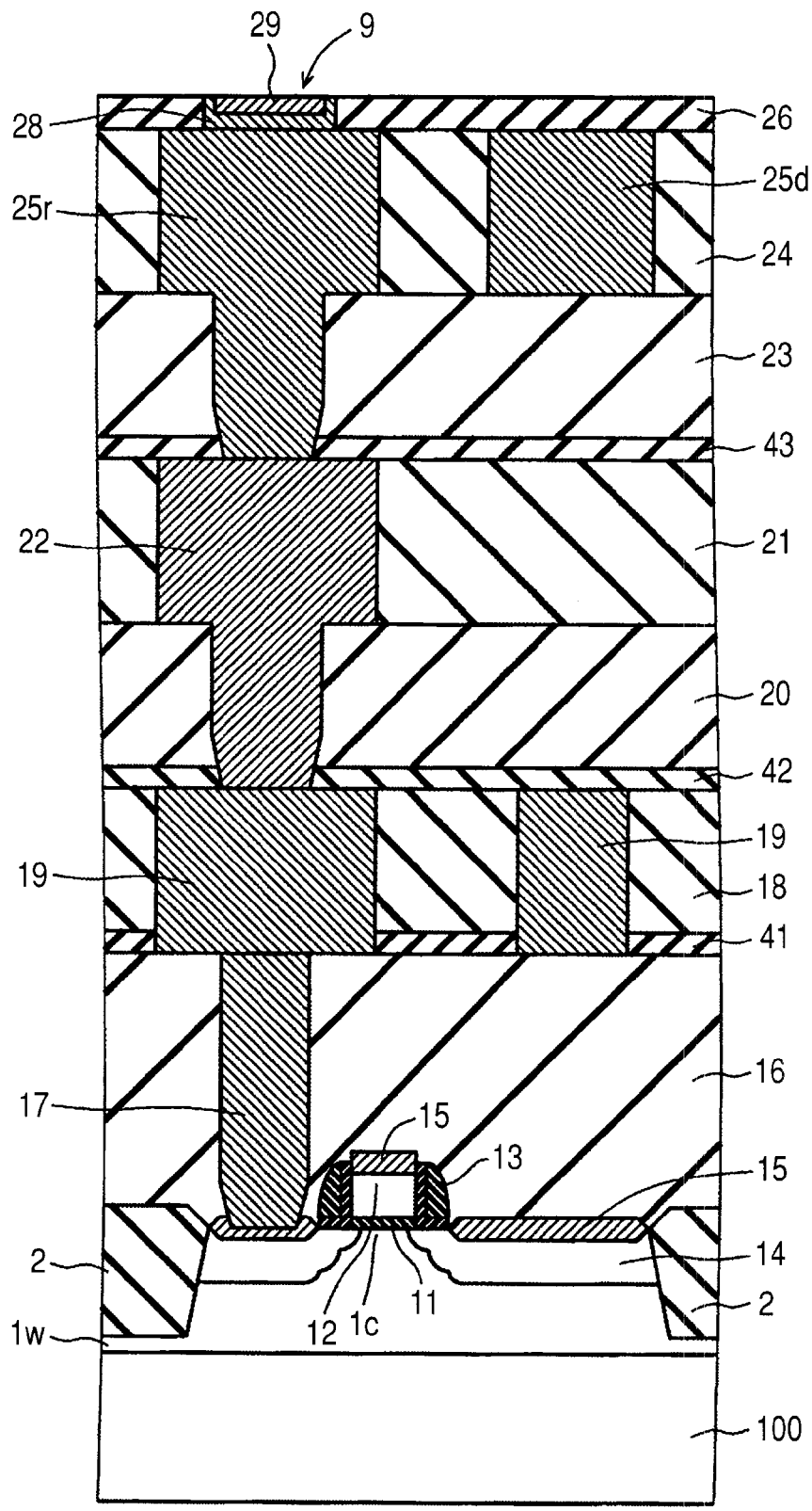
FIG. 20 is a cross-sectional view illustrating the manufacturing method of the first memory cell configuration in the MRAM of Embodiment 1.

As illustrated in FIG. 20, the barrier metal layer 28 and the via-burying metal layer 29 are subjected to CMP treatment to leave only the barrier metal layer 28 and the via-burying metal layer 29 in the via hole 9.

Figure 21:
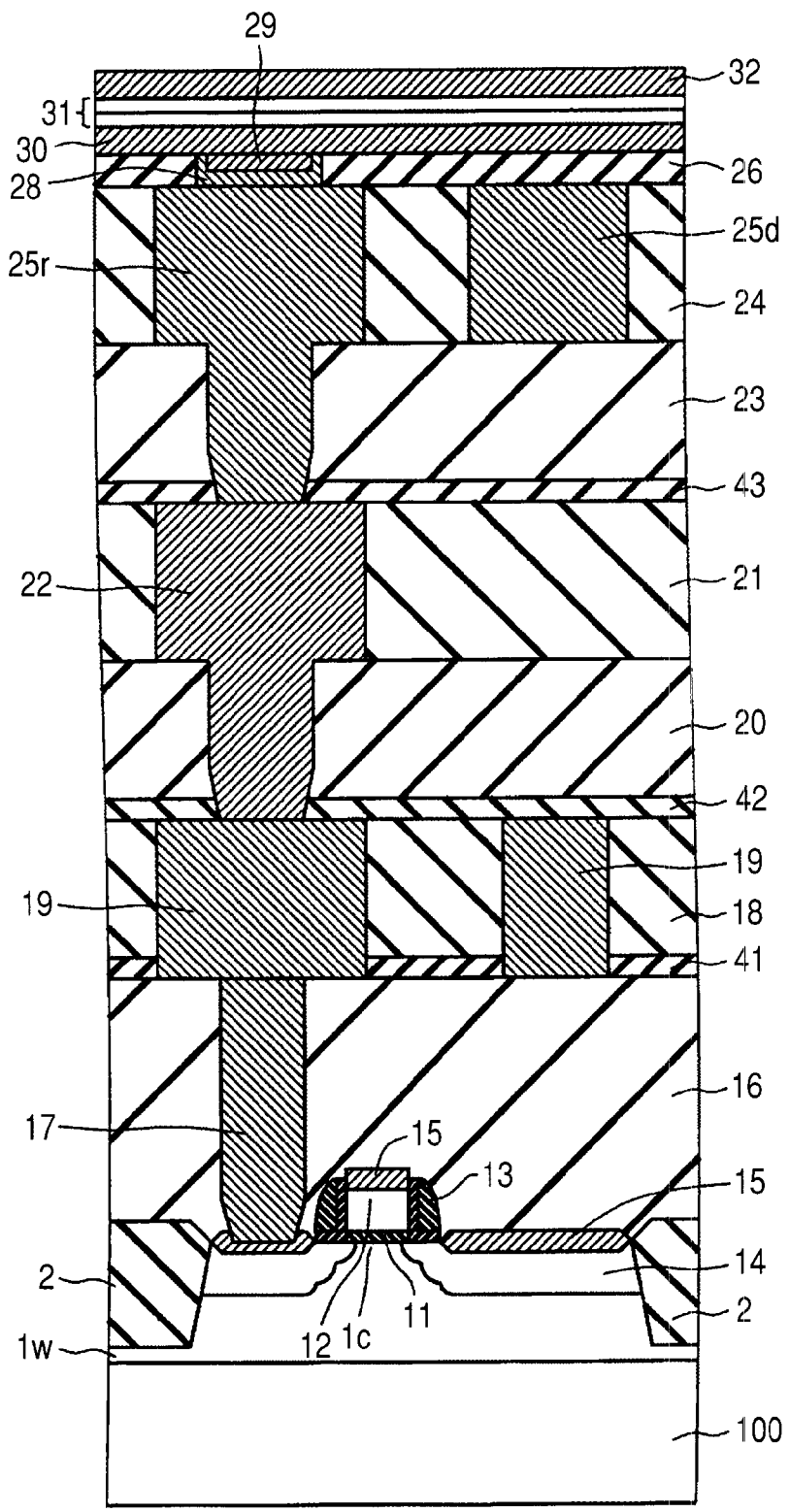
FIG. 21 is a cross-sectional view illustrating the manufacturing method of the first memory cell configuration in the MRAM of Embodiment 1.

As illustrated in FIG. 21, a lower electrode layer 30, an MTJ film 31, and an upper electrode layer 32 are stacked one after another over the entire surface. The lower electrode layer 30 and the upper electrode layer 32 use, for example, Ta as a constituent material and they are formed, for example, by sputtering.

Figure 22:
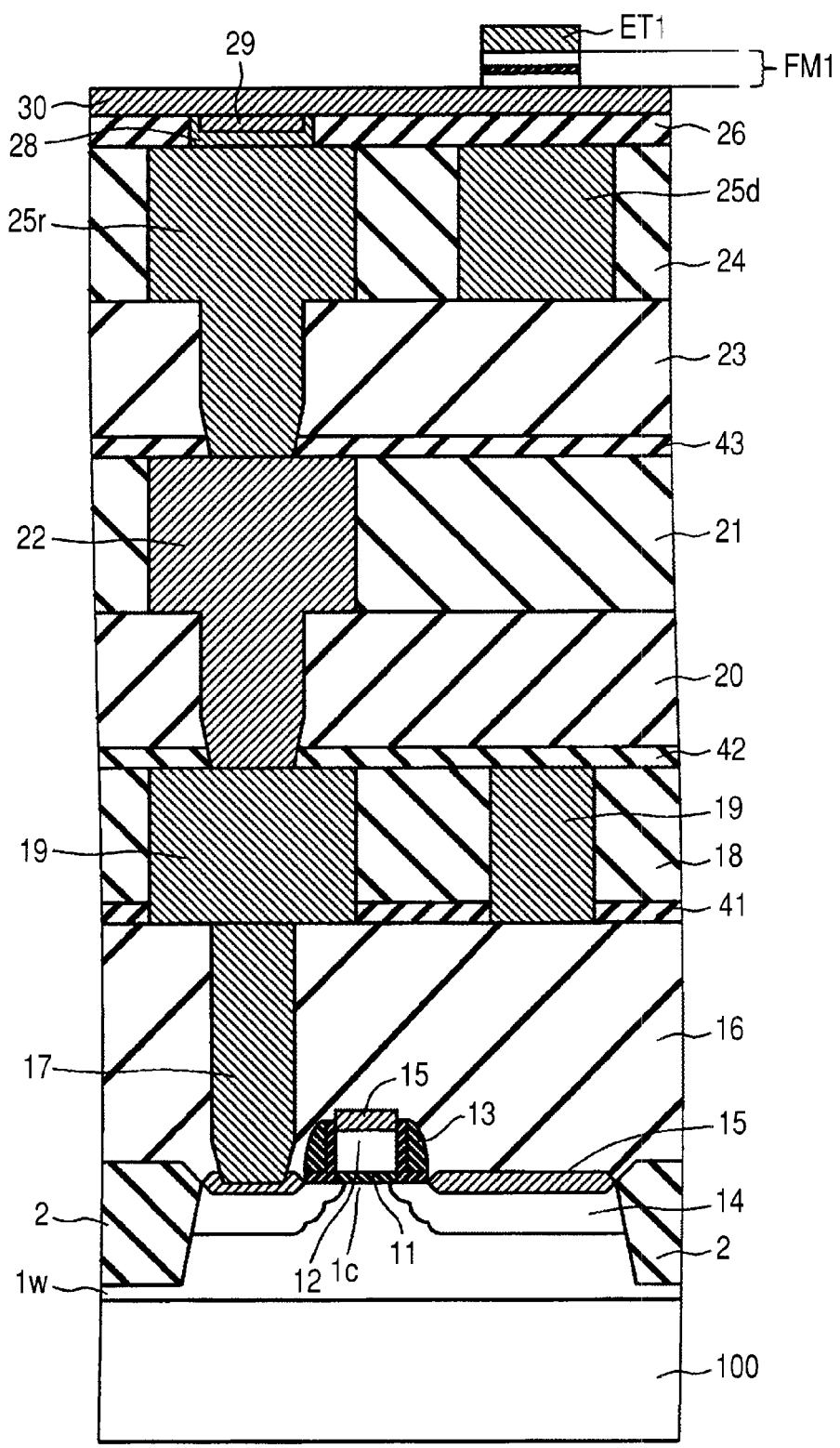
FIG. 22 is a cross-sectional view illustrating the manufacturing method of the first memory cell configuration in the MRAM of Embodiment 1.

As illustrated in FIG. 22, the MTJ film 31 and the upper electrode layer 32 are patterned with a patterned resist which is not illustrated in this figure to obtain a magnetic film FM1 and an upper electrode ET1.

Figure 23:
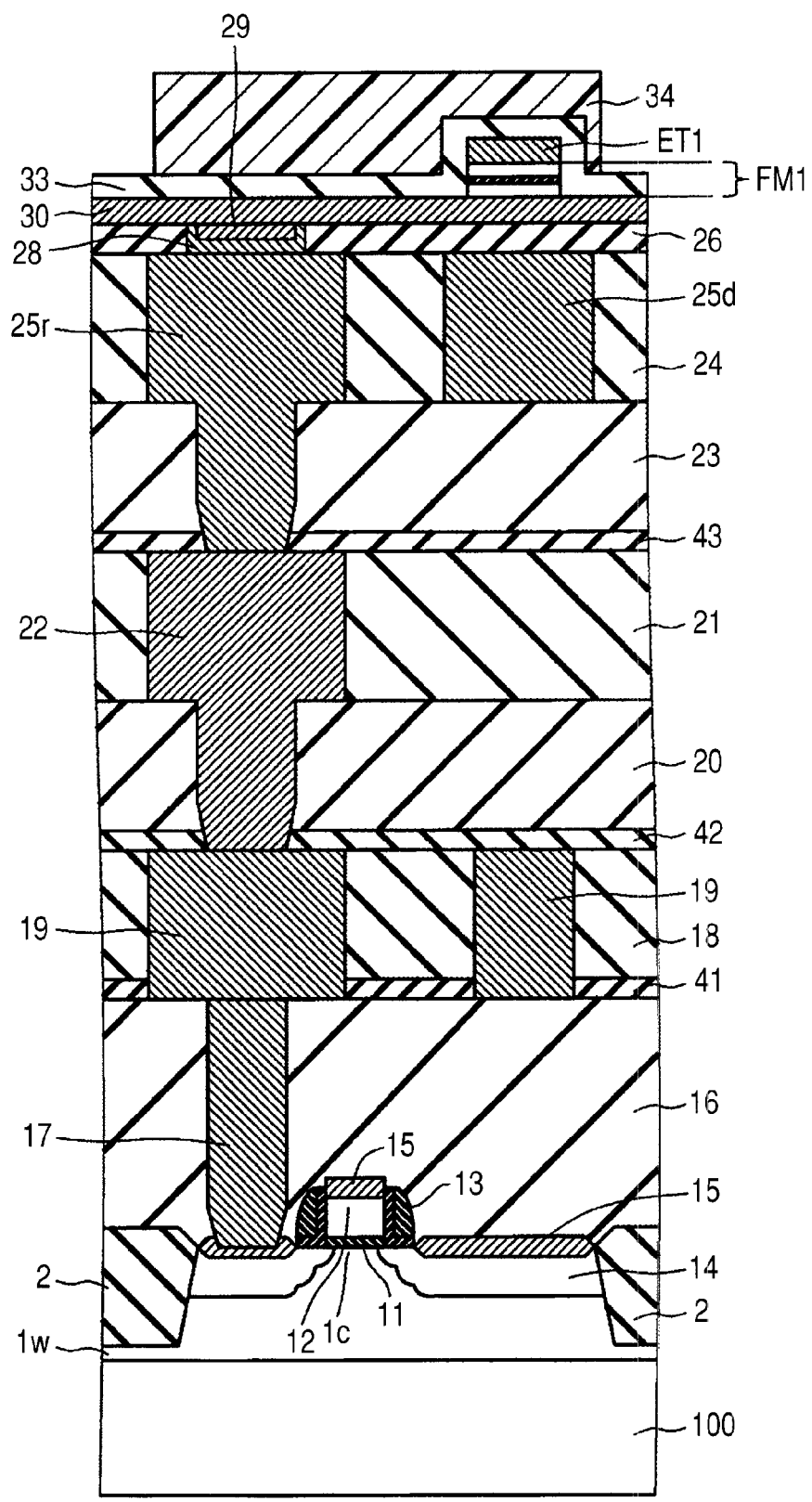
FIG. 23 is a cross-sectional view illustrating the manufacturing method of the first memory cell configuration in the MRAM of Embodiment 1.

As illustrated in FIG. 23, an MTJ's upper insulating film 33 is then formed over the entire surface including the magnetic film FM1 and the upper electrode ET1. The MTJ's upper insulating film 33 is formed at a temperature (for example, at temperature not greater than about 300° C.) not influencing on the electrical magnetic properties of a magnetic material forming the magnetic film FM1. The MTJ's upper insulating film 33 is therefore formed directly over the surface and side surface of the MTJ element MD1. A resist pattern 34 is selectively formed over the MTJ's upper insulating film 33 by lithography.

The MTJ's upper insulating film 33 corresponds to the MTJ's upper insulating film 51 (51c, 51p) illustrated in FIGS. 1 to 3. This means that when the MTJ's upper insulating film 33 formed as a compressive stress insulating film 51c is a film in the first mode and the MTJ's upper insulating film 33 formed as a tensile stress insulating film 51p is a film in the second mode.

Figure 24:
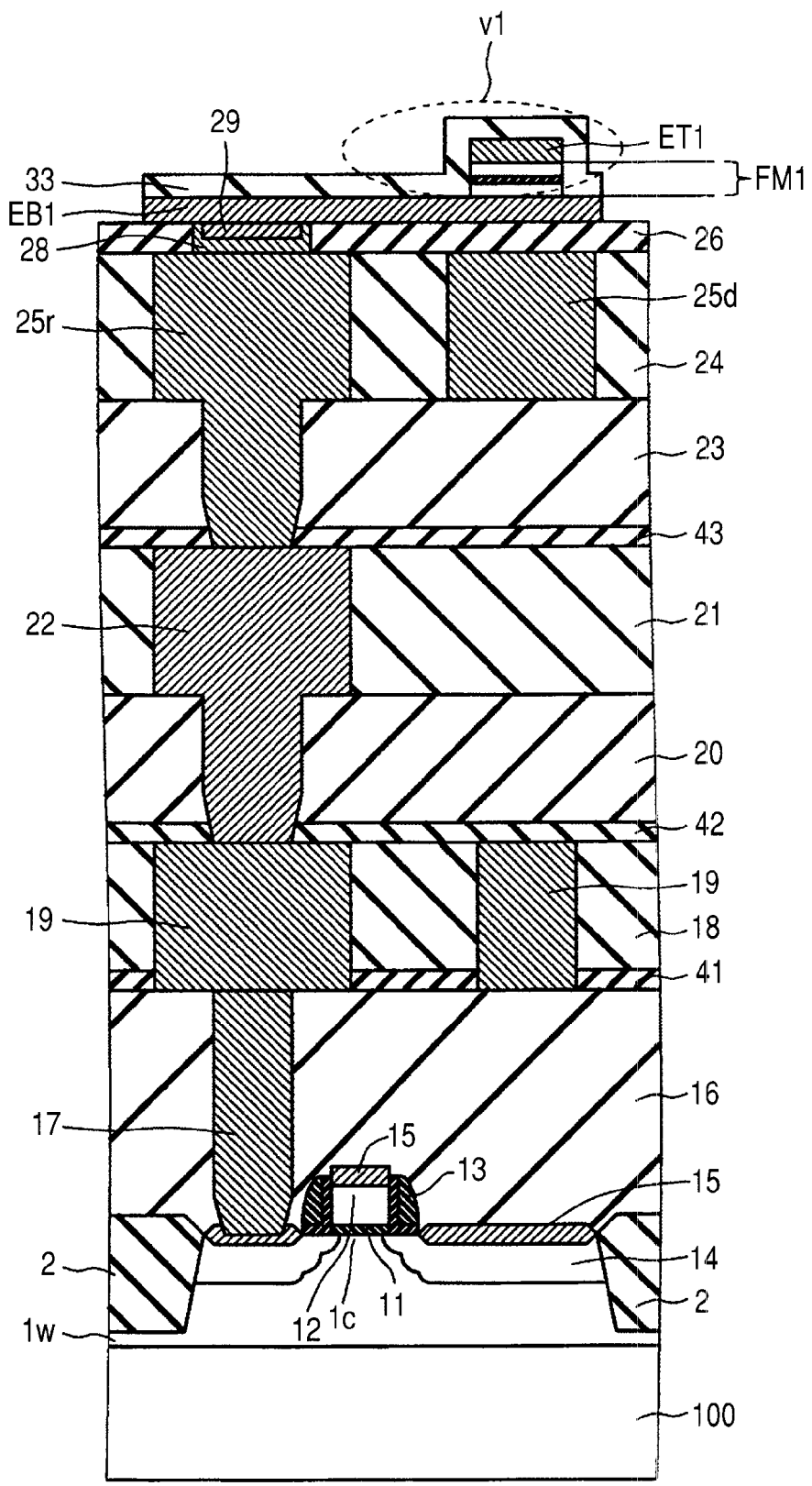
FIG. 24 is a cross-sectional view illustrating the manufacturing method of the first memory cell configuration in the MRAM of Embodiment 1.

As illustrated in FIG. 24, the MTJ's upper insulating film 33 and the lower electrode layer 30 are patterned by dry etching with a resist pattern 34 as a mask to obtain patterned MTJ's upper insulating film 33 and lower electrode EB1. As a result, as the MTJ's upper insulating film 51 of FIG. 1, the lower electrode EB1 and the MTJ's upper insulating film 33 having a planar shape (rectangular shape having a long side/short side ratio exceeding "1") whose long-side direction is aligned to the short-side direction of the MTJ element MD1 can be patterned simultaneously with one mask.

Since the MTJ's upper insulating film 33 and the lower electrode layer 30 are patterned simultaneously, the surface and the side surface of the MTJ element MD1 are protected with the MTJ's upper insulating film 33 at the time of patterning of the lower electrode layer 30. This enables to effectively suppress the generation of leakage current of the MTJ element MD1 resulting from a residue of the lower electrode layer 30 attached onto the side surface of the magnetic film FM1.

Figure 25:
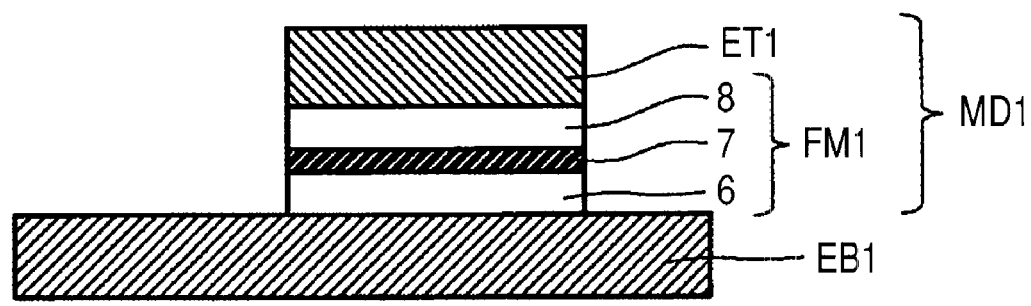
FIG. 25 is a cross-sectional view illustrating the manufacturing method of the first memory cell configuration in the MRAM of Embodiment 1.

FIG. 25 is an explanatory view illustrating an enlarged structure of a region v1 of interest of FIG. 24. From this figure, the MTJ's upper insulating film 33 is omitted. As illustrated in this figure, the MTJ element MD1 having the magnetic film FM1 and the upper electrode ET1 can be obtained over the lower electrode EB1. The magnetic film FM1 has a stacked structure of a lower magnetic film 6, a tunnel insulating film 7, and an upper magnetic film 8.

Figure 26:
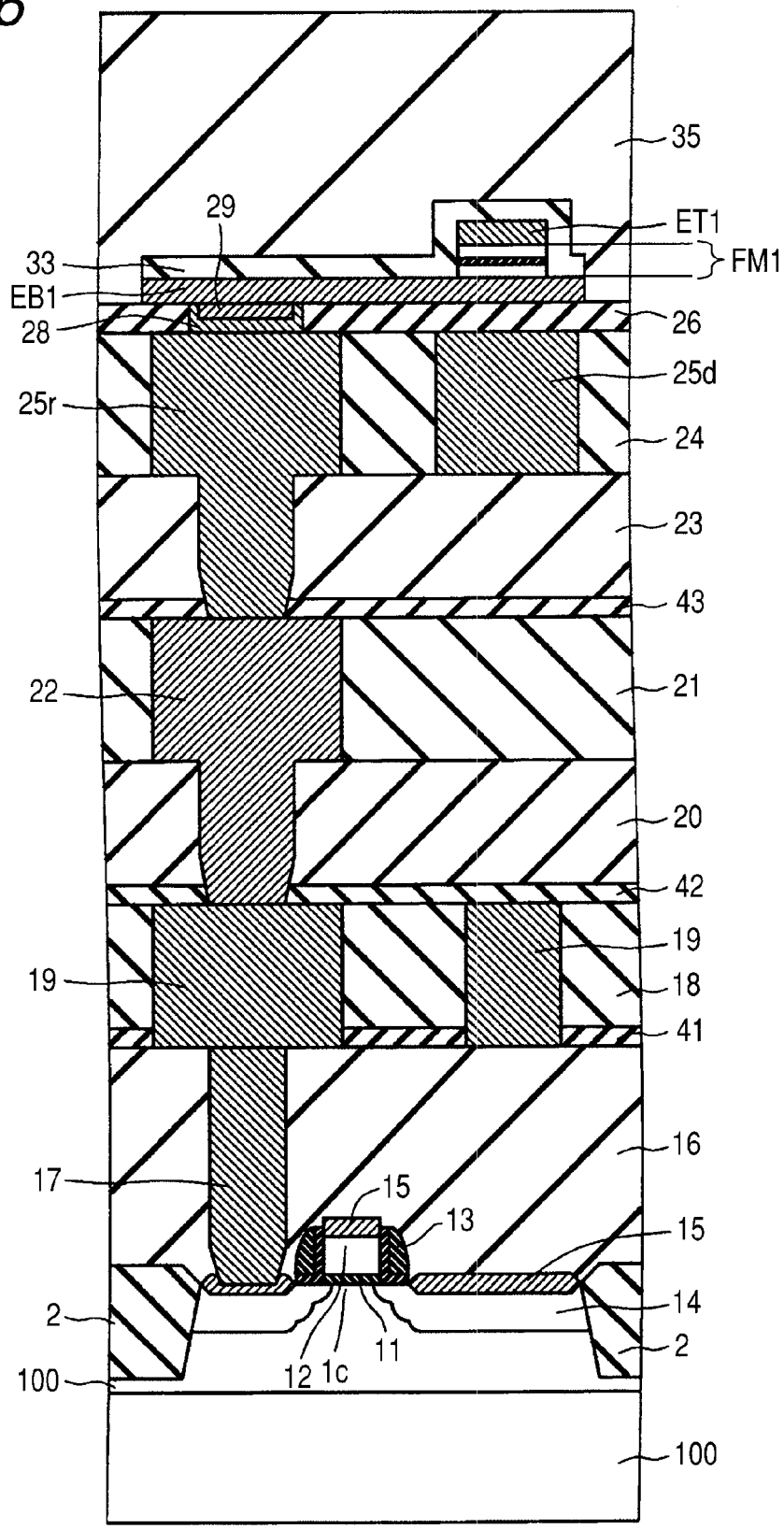
FIG. 26 is a cross-sectional view illustrating the manufacturing method of the first memory cell configuration in the MRAM of Embodiment 1.

As illustrated in FIG. 26, an interlayer insulating film 35 made of $SiO_2$ is formed over the entire surface.

Figure 27:
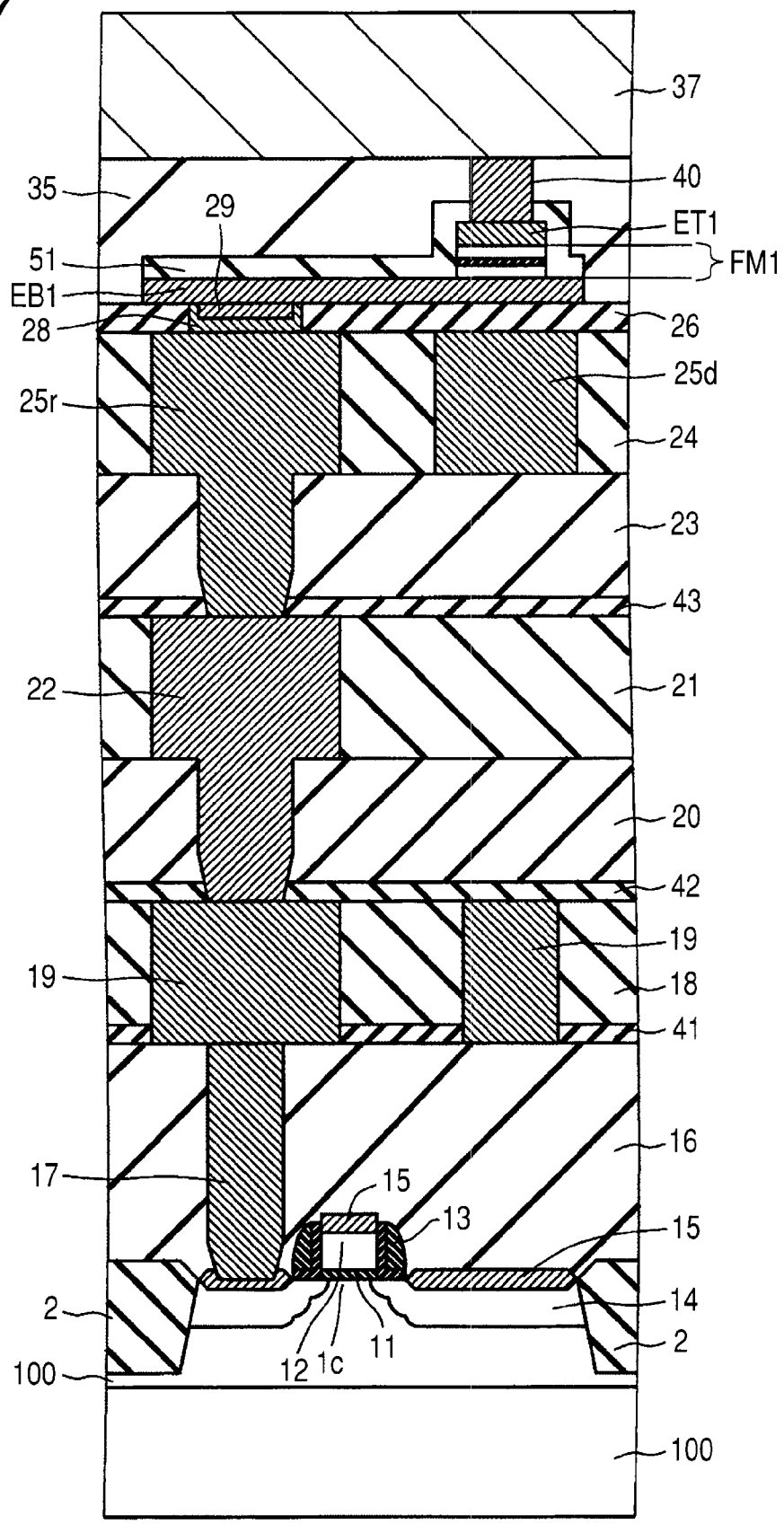
FIG. 27 is a cross-sectional view illustrating the manufacturing method of the first memory cell configuration in the MRAM of Embodiment 1.

As illustrated in FIG. 27, the interlayer insulating film 35 is subjected to CMP treatment to planarize the interlayer insulating film 35. Then, a via hole 40 penetrating through the interlayer insulating film 35 is formed above the upper electrode ET1.

A bit line is then obtained by filling the via hole 40 with a Cu interconnect 37 and at the same forming the Cu interconnect 37 over the interlayer insulating film 35. As a result, the Cu interconnect 37 is electrically coupled to the upper electrode ET1 of the MTJ element MD1 via the via hole 40. In such a manner, the Cu interconnect 37 forming a fourth-level metal interconnect is formed.

Finally, an interlayer insulating film (not illustrated) is formed over the entire surface, whereby the MRAM having the first memory cell configuration according to Embodiment 1 using the MTJ element MD1 and the lower electrode EB1 illustrated in FIG. 8 as a memory cell is completed.

It is also possible to form an upper electrode ET1 having a large thickness after the step illustrated in FIG. 22 by increasing the thickness of the upper electrode layer 32 in the step illustrated in FIG. 21.

Figure 28:
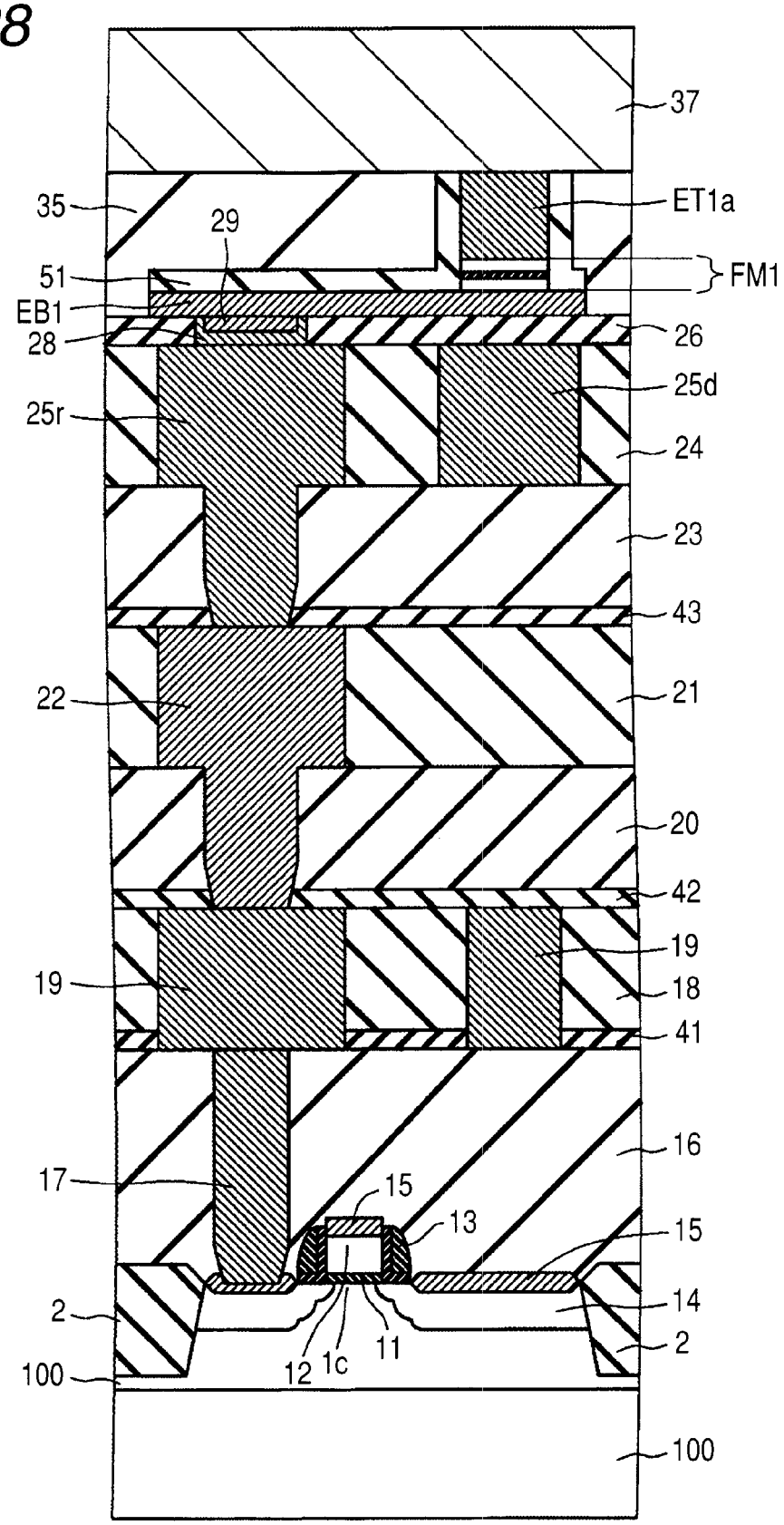
FIG. 28 is a cross-sectional view illustrating the manufacturing method of the first memory cell configuration in the MRAM of Embodiment 1.

As illustrated in FIG. 28, a bit line is obtained by subjecting the interlayer insulating film 35 to CMP treatment until the upper surface of the upper electrode E11a is exposed, and then forming a Cu interconnect 37 over the interlayer insulating film 35. As a result, the Cu interconnect 37 is electrically coupled directly to the upper electrode E11a of the MTJ element MD1 without disposing another via hole.

It is thus possible to directly couple the Cu interconnect 37 of the fourth-level metal interconnect to the upper electrode E11a of the MTJ element MD1, thereby omitting the via hole 40.

(Manufacturing Method (Second Memory Cell Configuration))

Figure 29:
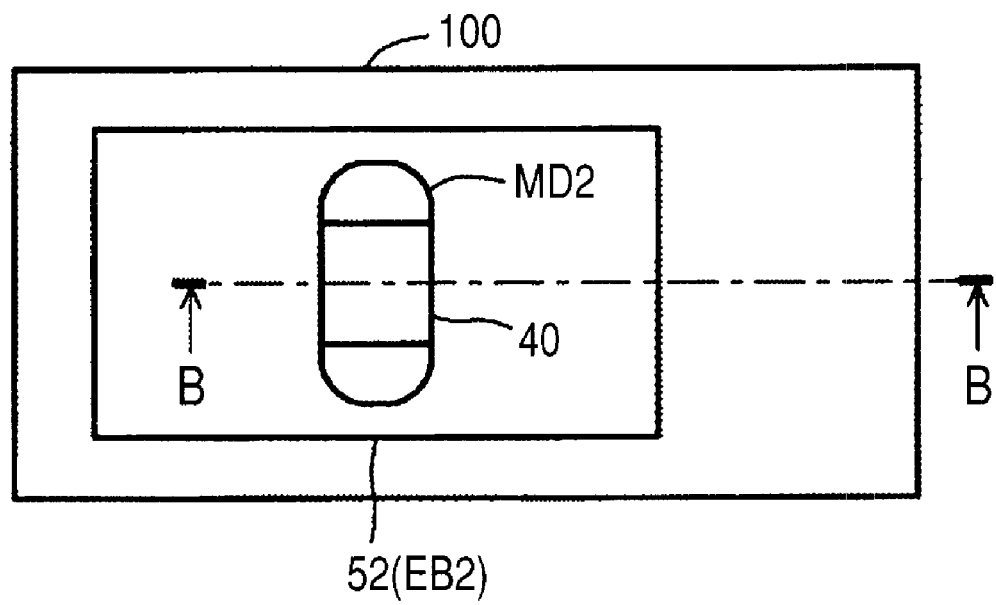
FIG. 29 is a plan view illustrating the planar structure in the second memory cell configuration according to Embodiment 1.
Figure 30:
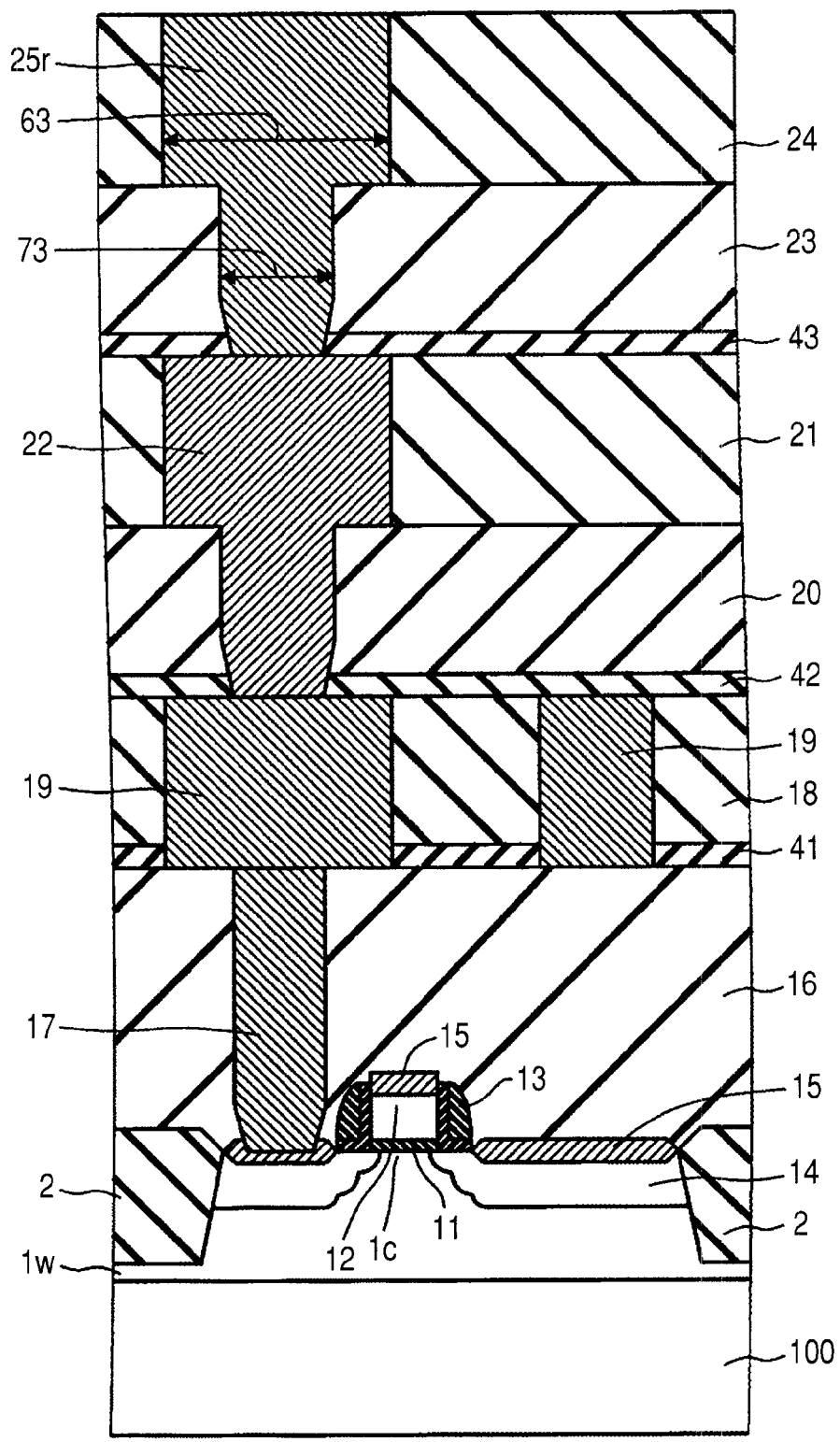
FIG. 30 is a cross-sectional view illustrating a portion of a manufacturing method of a second memory cell configuration in the MRAM according to Embodiment 1.

FIG. 29 is a plan view illustrating the planar structure in the second memory cell configuration according to Embodiment 1. As illustrated in this figure, a lower electrode EB2 having a horizontally-long rectangular planar shape is formed over the semiconductor substrate 100 and an MTJ element MD2 having a vertically-long oval planar shape is formed at the center of the lower electrode EB2. In addition, an MTJ's upper insulating film 52 having a horizontally-long rectangular planar shape similar to that of the lower electrode EB2 is formed while covering therewith the MTJ element MD2. The MTJ element MD2 has, at the center thereof, a via hole 40.

FIGS. 30 to 40 are each a cross-sectional view illustrating a portion of a manufacturing method of the second memory cell configuration of the MRAM according to Embodiment 1. FIGS. 30 to 40 are cross-sectional views taken along a line B-B of FIG. 29.

First, after similar steps to those of the first memory cell configuration as illustrated in FIGS. 9 to 16, a nitride film 43 and interlayer insulating films 23 and 24 are formed over the entire surface, and a minute hole 73 is selectively formed by penetrating through the nitride film 43 and the interlayer insulating film 23. Further, an interconnection hole 63 penetrating through the interlayer insulating film 24 over a region including the minute hole 73 is selectively formed. A Cu interconnect 25 (only lead line 25r) is then formed while filling the minute hole 73 and the interconnection hole 63 therewith. The lead line 25r is electrically coupled to the Cu interconnect 22. In such a manner, the Cu interconnect 25 forming a third-level metal interconnect is formed by the damascene technology.

Figure 31:
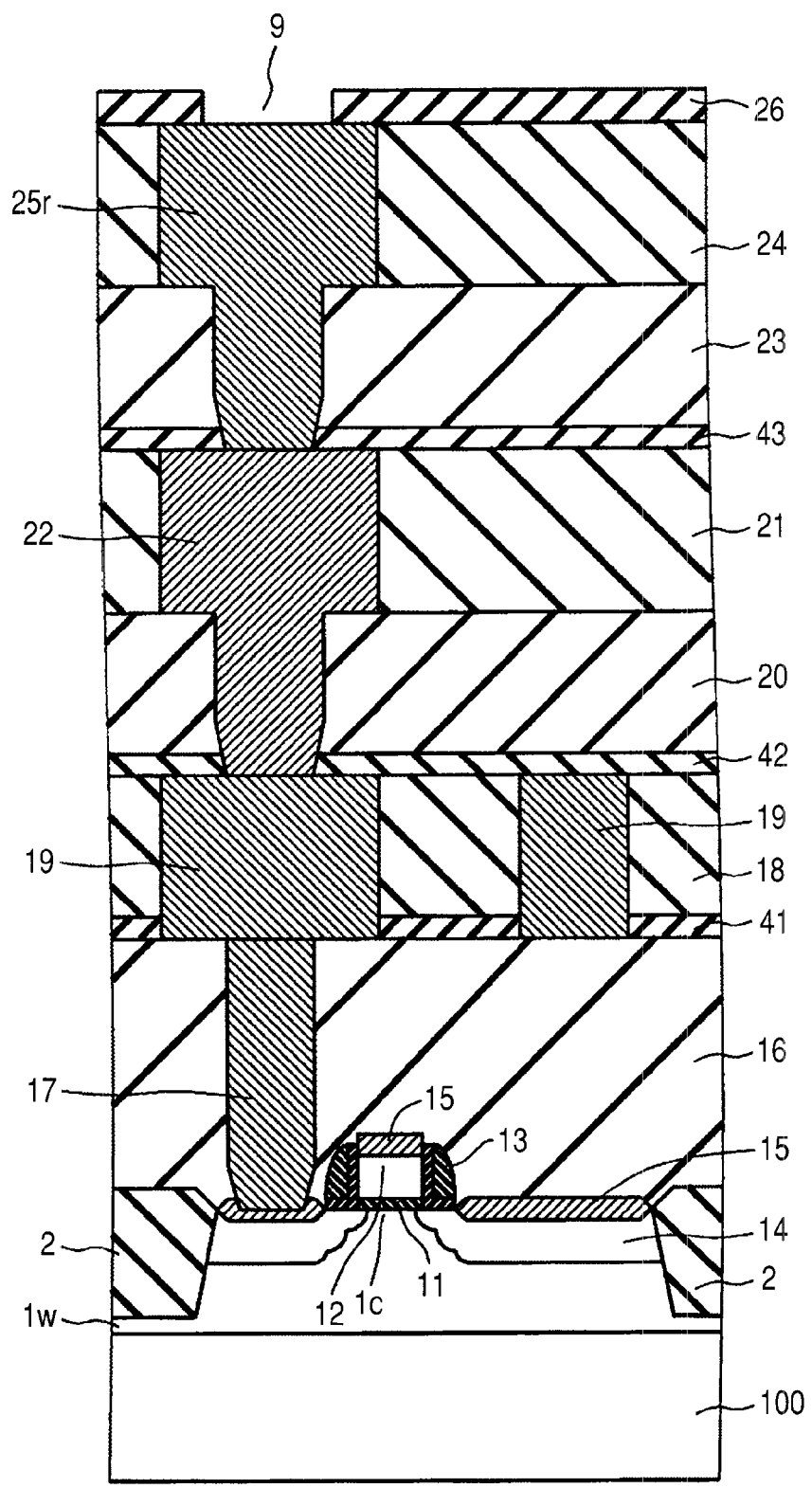
FIG. 31 is a cross-sectional view illustrating a portion of the manufacturing method of the second memory cell configuration in the MRAM according to Embodiment 1.

As illustrated in FIG. 31, an interlayer insulating film 26 is then formed over the entire surface and a via hole 9 penetrating through a portion of the interlayer insulating film over a region of the lead line 25r in the memory cell portion is selectively formed.

Figure 32:
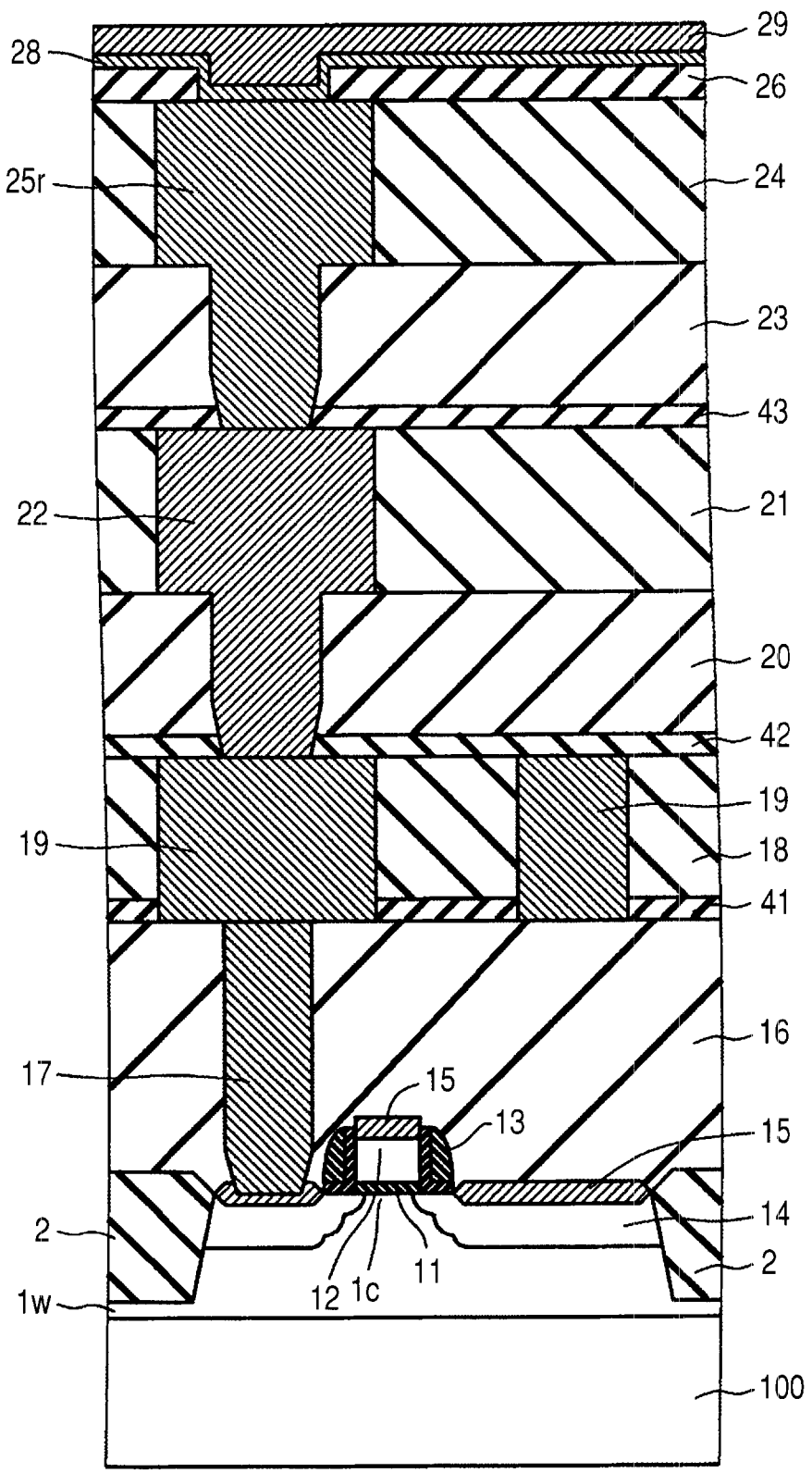
FIG. 32 is a cross-sectional view illustrating a portion of the manufacturing method of the second memory cell configuration in the MRAM according to Embodiment 1.

As illustrated in FIG. 32, a barrier metal layer 28 is then formed over the entire surface including the inside of the via hole 9 and a via-burying metal layer 29 is formed over the barrier metal layer 28.

Figure 33:
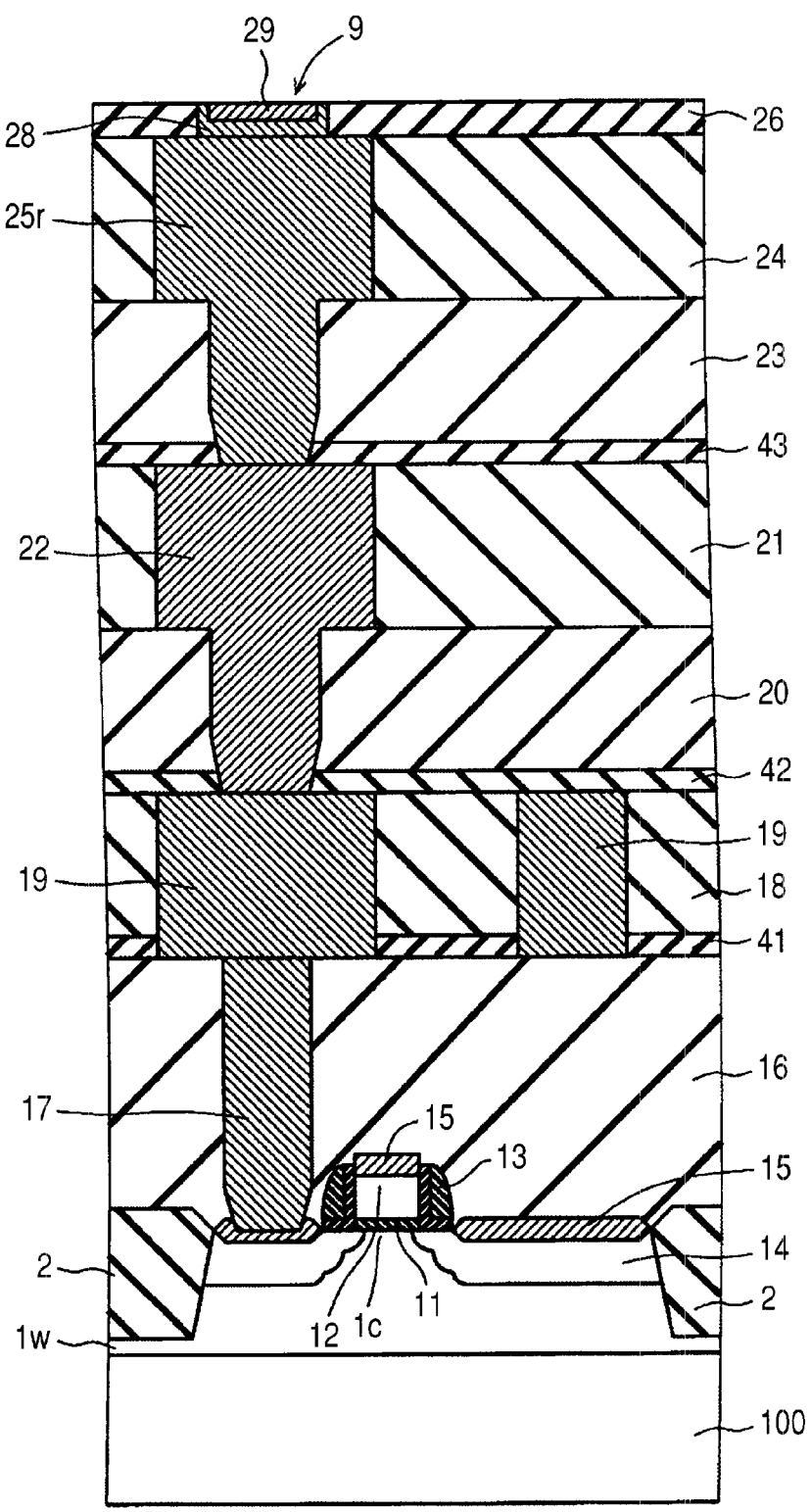
FIG. 33 is a cross-sectional view illustrating a portion of the manufacturing method of the second memory cell configuration in the MRAM according to Embodiment 1.

As illustrated in FIG. 33, the barrier metal layer 28 and the via-burying metal layer 29 are subjected to CMP treatment to leave only the barrier metal layer 28 and the via-burying metal layer 29 in the via hole 9.

Figure 34:
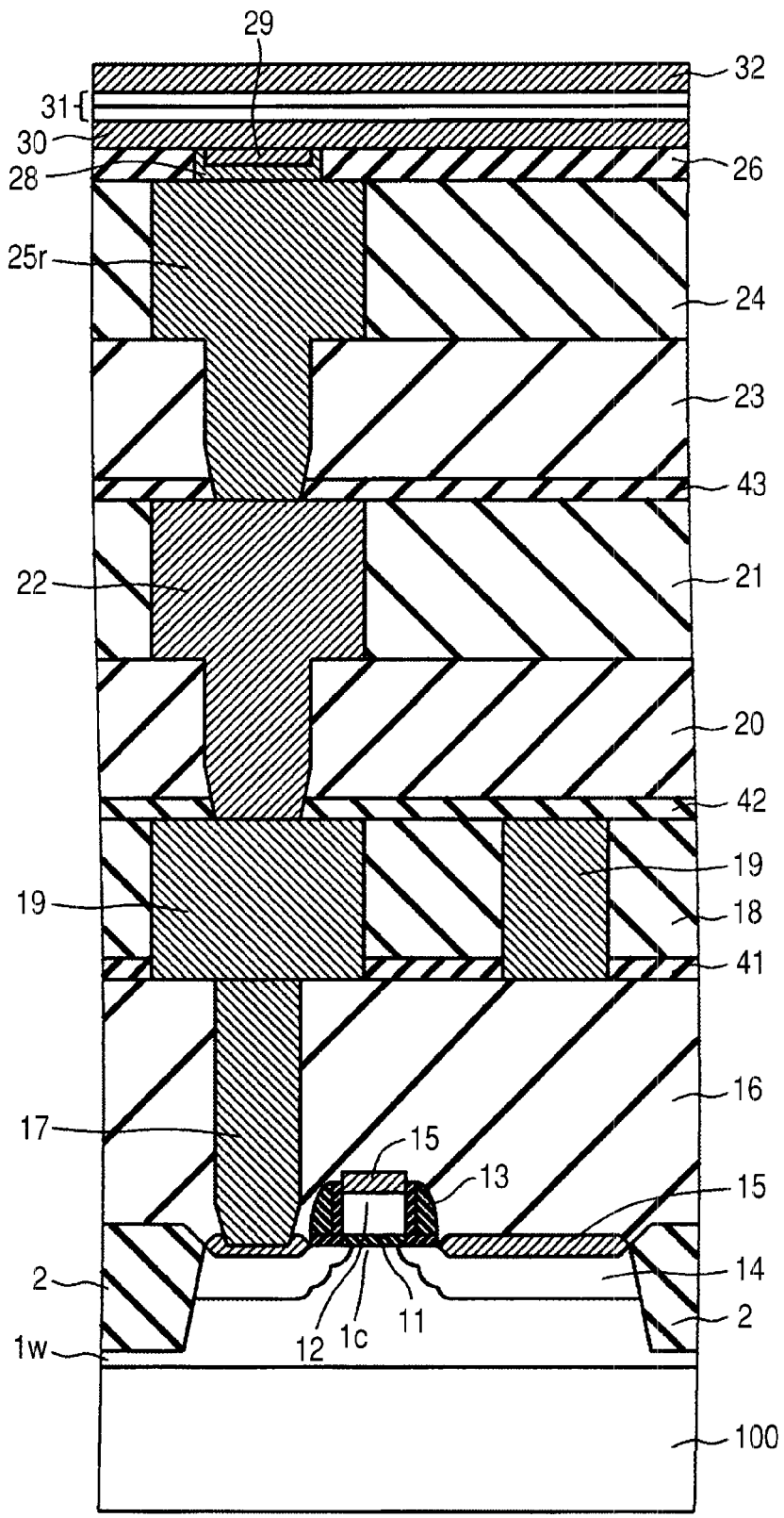
FIG. 34 is a cross-sectional view illustrating a portion of the manufacturing method of the second memory cell configuration in the MRAM according to Embodiment 1.

As illustrated in FIG. 34, a lower electrode layer 30, an MTJ film 31, and an upper electrode layer 32 are stacked one after another over the entire surface. The lower electrode layer 30 and the upper electrode layer 32 use, for example, Ta as a constituent material and they are formed, for example, by sputtering.

Figure 35:
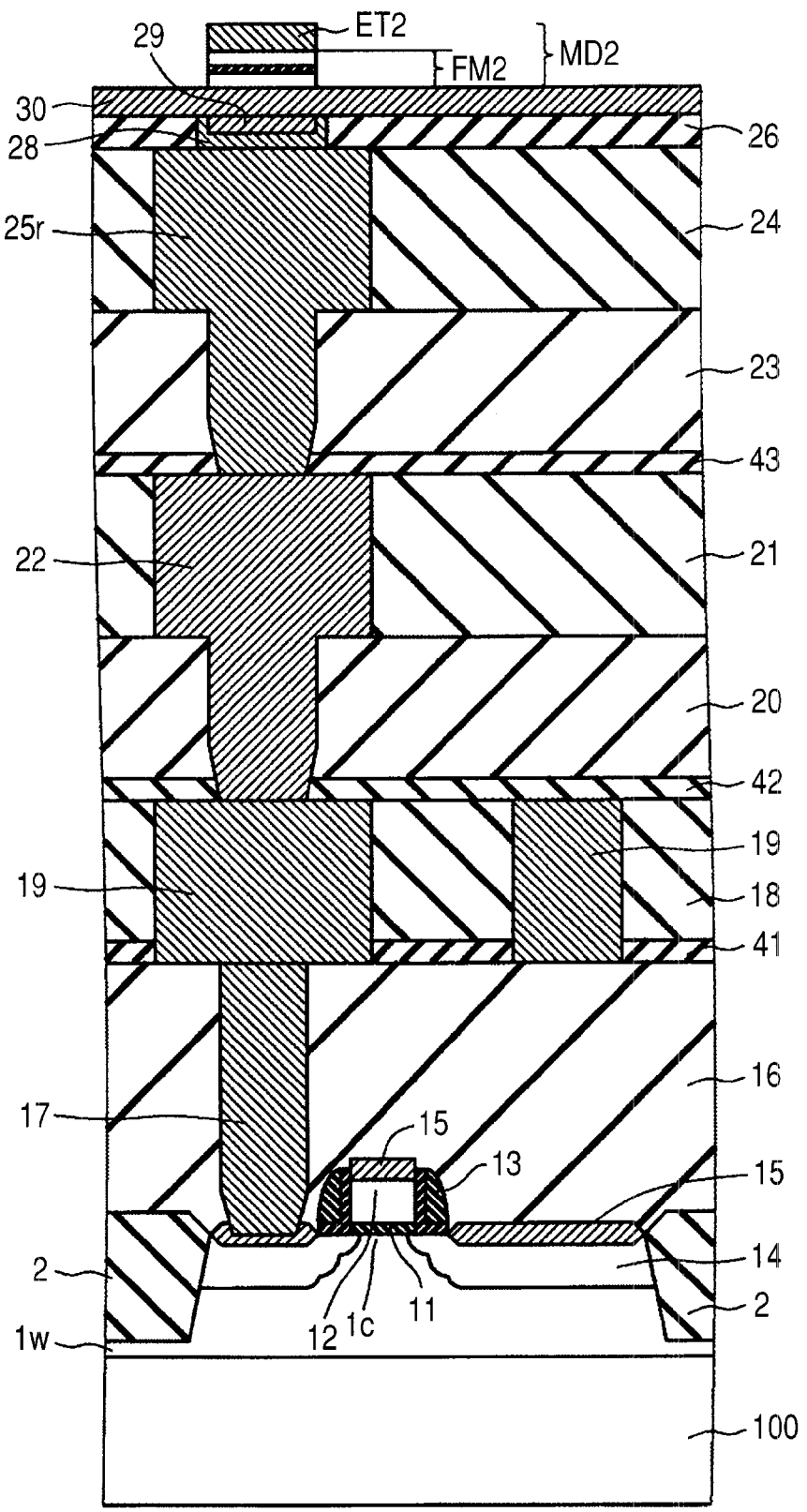
FIG. 35 is a cross-sectional view illustrating a portion of the manufacturing method of the second memory cell configuration in the MRAM according to Embodiment 1.

As illustrated in FIG. 35, the MTJ film 31 and the upper electrode layer 32 are patterned with a patterned resist which is not illustrated in this figure to obtain a magnetic film FM2 and an upper electrode ET2. These magnetic film FM2 and upper electrode ET2 form the MTJ element MD2.

As a result, the MTJ element MD2 can be formed right above the barrier metal layer 28 and the via-burying metal layer 29 filled in the via hole 9, because the MTJ element MD2 does not need a digit line 25d different from the MTJ element MD1.

Figure 36:
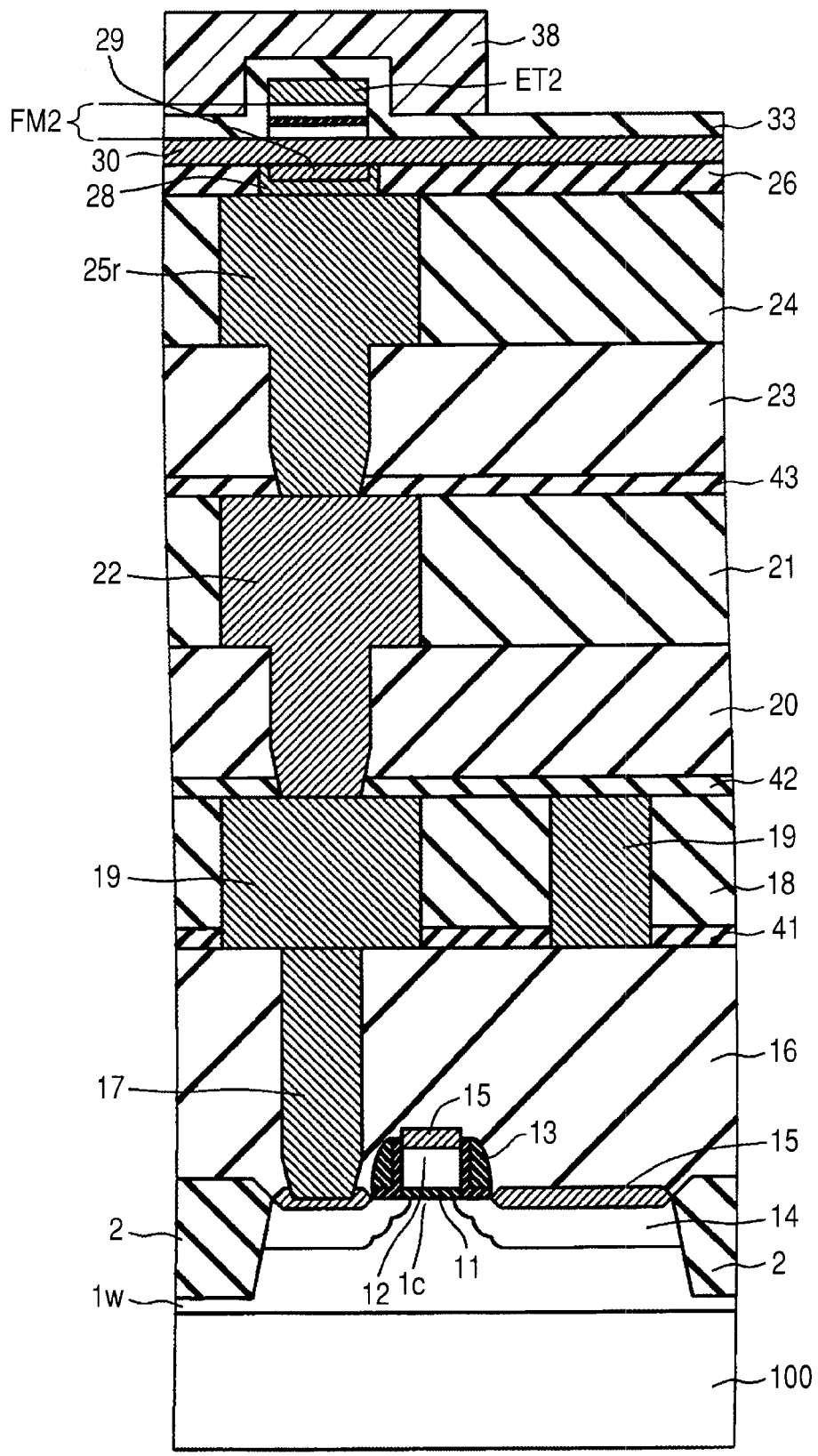
FIG. 36 is a cross-sectional view illustrating a portion of the manufacturing method of the second memory cell configuration in the MRAM according to Embodiment 1.

As illustrated in FIG. 36, an MTJ's upper insulating film 33 is then formed over the entire surface including the magnetic film FM2 and the upper electrode ET2. The MTJ's upper insulating film 33 is formed at a temperature (for example, at temperature not higher than about 300° C.) not influencing on the electrical magnetic properties of a magnetic material forming the magnetic film FM2. The MTJ's upper insulating film 33 is formed directly on the side surface and the surface of the MTJ element MD2. A resist pattern 38 is selectively formed over the MTJ's upper insulating film 33 by lithography.

The MTJ's upper insulating film 33 corresponds to the MTJ's upper insulating film 52 (52c, 52p) illustrated in FIGS. 4 to 6. This means that when the MTJ's upper insulating film 33 formed as a compressive stress insulating film 52c is a film in the first mode and the MTJ's upper insulating film 33 formed as a tensile stress insulating film 52p is a film in the second mode.

Figure 37:
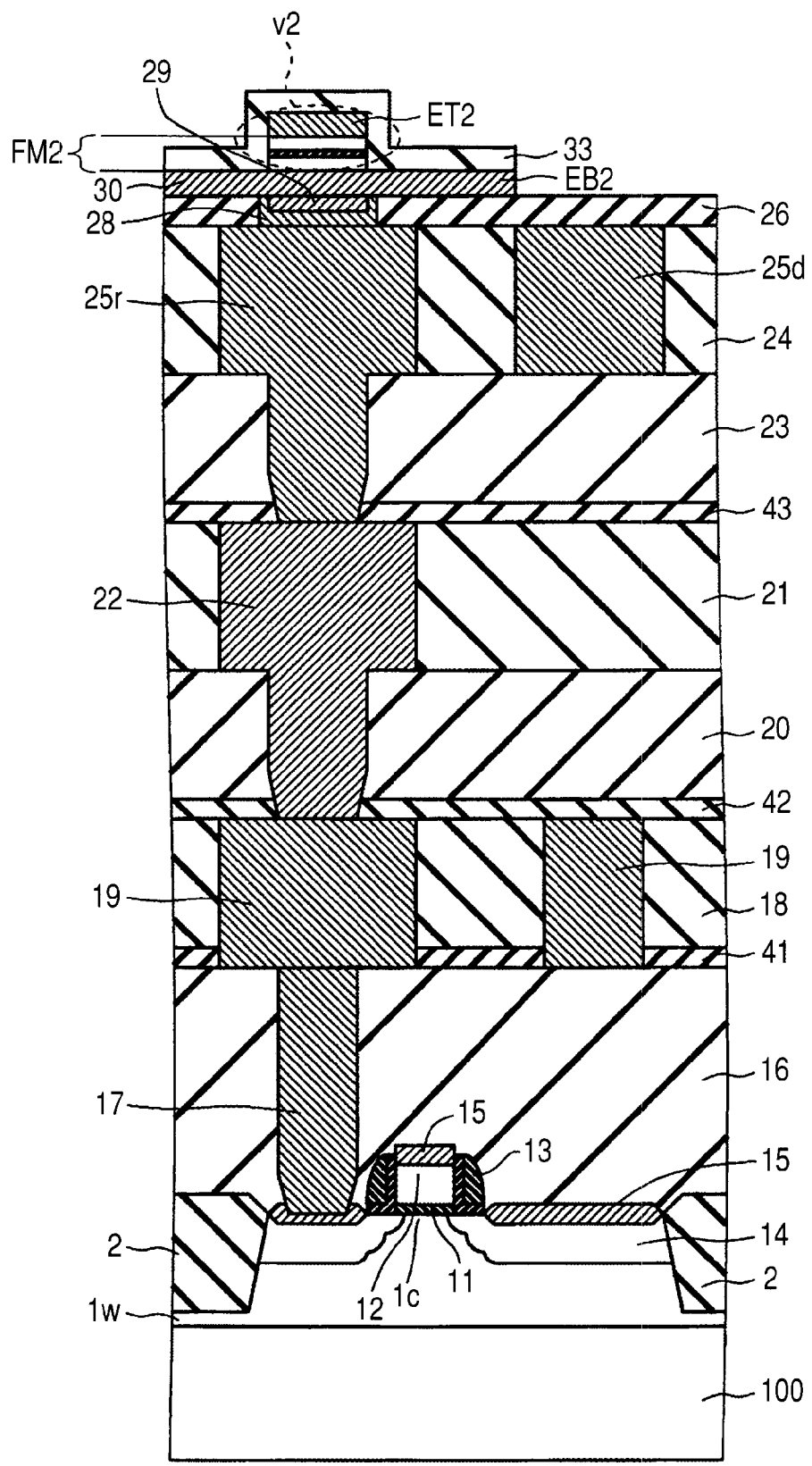
FIG. 37 is a cross-sectional view illustrating a portion of the manufacturing method of the second memory cell configuration in the MRAM according to Embodiment 1.

As illustrated in FIG. 37, the MTJ's upper insulating film 33 and the lower electrode EB2 are patterned simultaneously by dry etching with a resist pattern 38 as a mask to obtain patterned MTJ's upper insulating film 33 and lower electrode EB2.

Since the MTJ's upper insulating film 33 and the lower electrode layer 30 are patterned simultaneously, the surface and the side surface of the MTJ element MD2 are protected with the MTJ's upper insulating film 33 at the time of patterning of the lower electrode layer 30. This enables to effectively suppress the generation of leakage current of the MTJ element MD2 resulting from a residue of the lower electrode layer 30 attached onto the side surface of the magnetic film FM2.

Figure 38:
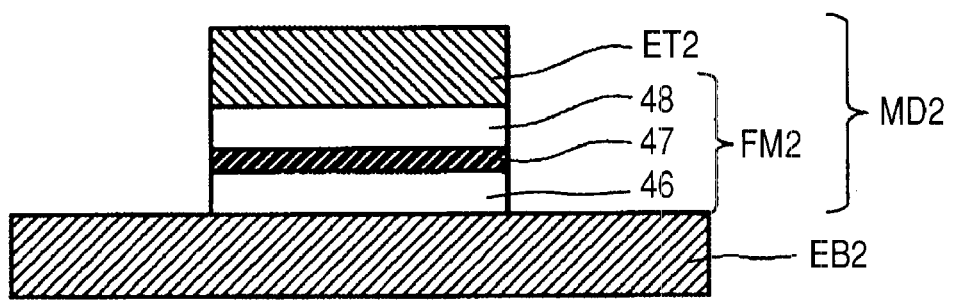
FIG. 38 is a cross-sectional view illustrating a portion of the manufacturing method of the second memory cell configuration in the MRAM according to Embodiment 1.

FIG. 38 is an explanatory view illustrating an enlarged structure of a region v2 of interest of FIG. 37. From this figure, the MTJ's upper insulating film 33 is omitted. As illustrated in this figure, an MTJ element MD2 having the magnetic film FM2 and the upper electrode ET2 can be obtained over the lower electrode EB2. The magnetic film FM2 has a stacked structure of a lower magnetic film 46, a tunnel insulating film 47, and an upper magnetic film 48.

Figure 39:
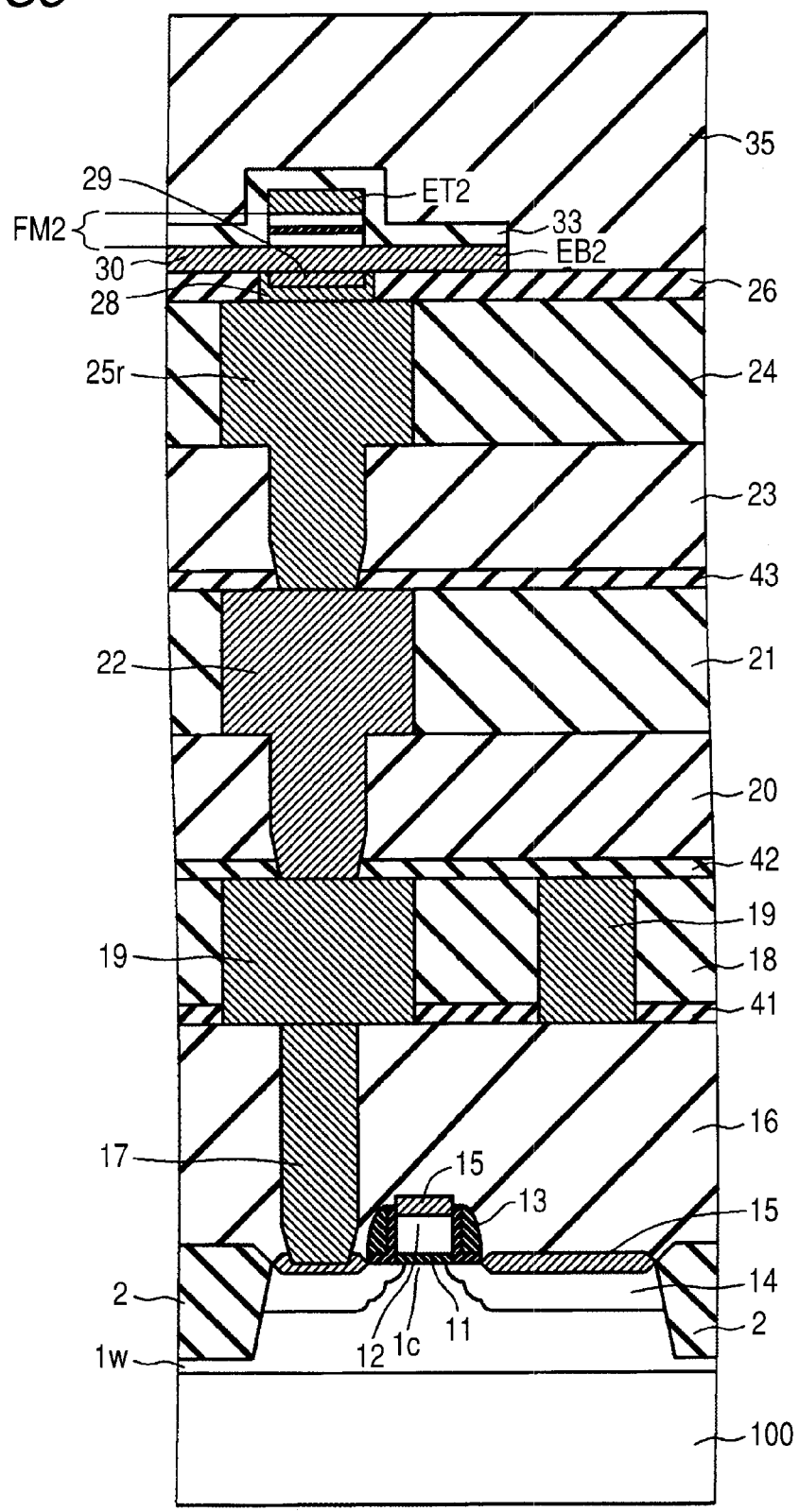
FIG. 39 is a cross-sectional view illustrating a portion of the manufacturing method of the second memory cell configuration in the MRAM according to Embodiment 1.

As illustrated in FIG. 39, an interlayer insulating film 35 made of $SiO_2$ is formed over the entire surface.

Figure 40:
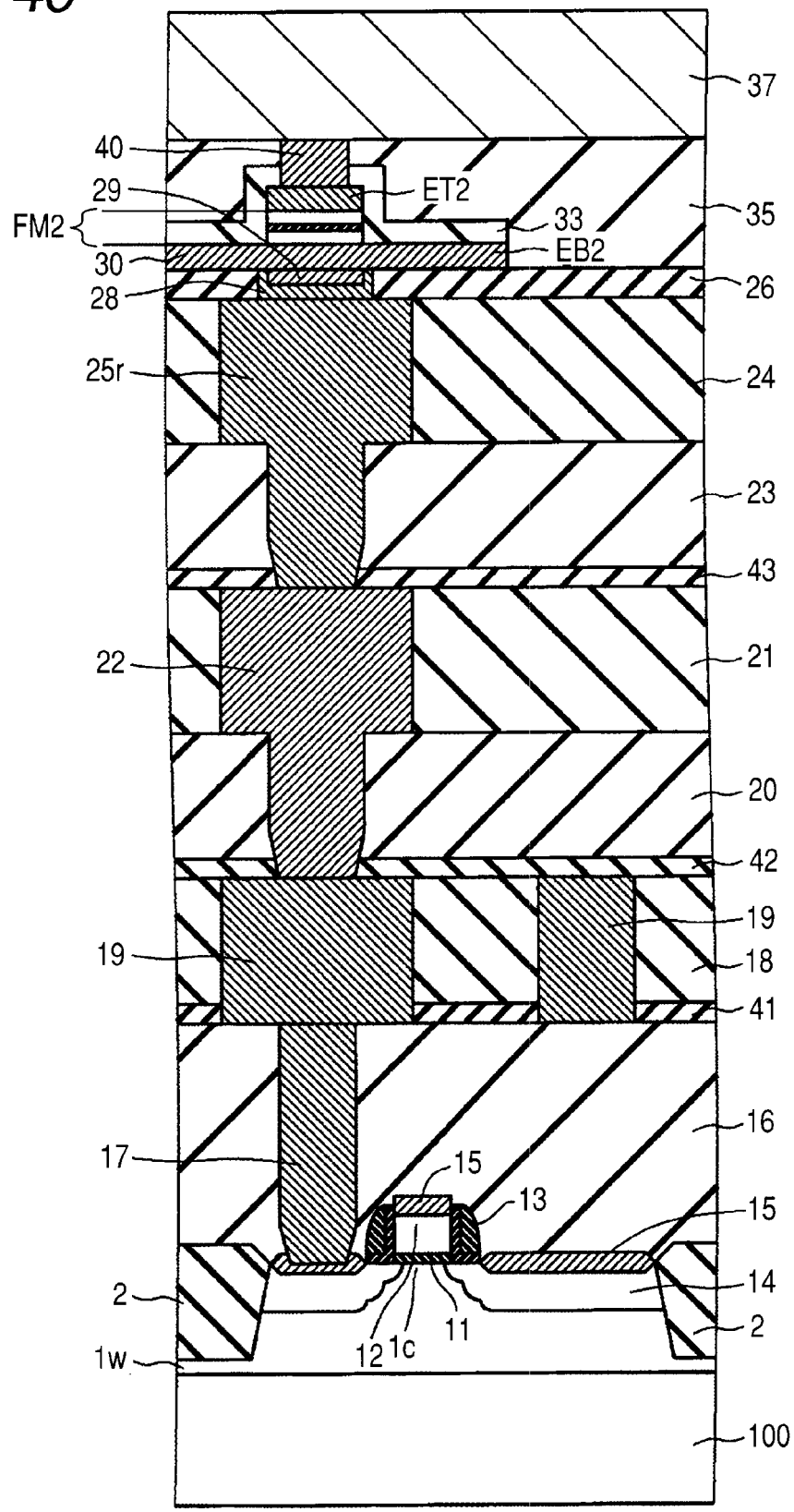
FIG. 40 is a cross-sectional view illustrating a portion of the manufacturing method of the second memory cell configuration in the MRAM according to Embodiment 1.

As illustrated in FIG. 40, the interlayer insulating film 35 is subjected to CMP treatment to planarize the interlayer insulating film 35. Then, a via hole 40 penetrating through the interlayer insulating film 35 is formed above the upper electrode ET2.

A bit line is then obtained by filling the via hole 40 with a Cu interconnect 37 and at the same forming the Cu interconnect 37 over the interlayer insulating film 35. A the result, the Cu interconnect 37 is electrically coupled to the upper electrode ET2 of the MTJ element MD2 via the via hole 40. In such a manner, the Cu interconnect 37 configuring a fourth-level metal interconnect is formed.

Finally, an interlayer insulating film (not illustrated) is formed over the entire surface, whereby the MRAM having the second memory cell configuration according to Embodiment 1 using the MTJ element MD2 and the lower electrode EB2 illustrated in FIG. 29 as a memory cell is completed.

It is also possible to form an upper electrode ET2 having a larger thickness after the step illustrated in FIG. 35 as in the first memory cell configuration by increasing the thickness of the upper electrode layer 32 in the step illustrated in FIG. 34. As a result, in the second memory cell configuration as in the first memory cell configuration, the Cu interconnect 37 forming a fourth-level metal interconnect can be directly coupled to the upper electrode ET2 of the MTJ element MD2 and a via hole 40 can be omitted.

EMBODIMENT 2

Principle

Figure 41:
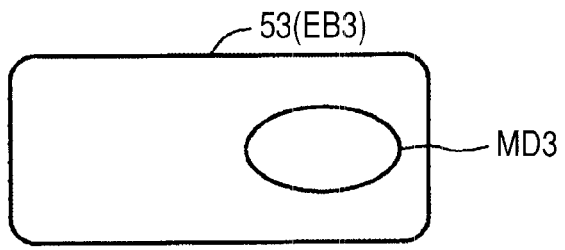
FIG. 41 is an explanatory view illustrating the planar schematic structure of a first memory cell configuration of an MRAM according to Embodiment 2 of the invention.

FIG. 41 is an explanatory view illustrating the planar schematic structure of a first memory cell configuration of an MRAM (semiconductor device) according to Embodiment 2 of the invention.

As illustrated in this figure, an MTJ element MD3 having a horizontally-long oval planar shape is formed on the right side of a lower electrode EB3 having a horizontally-long rectangular planar shape. The long axis direction of the MTJ element MD3 is set at an easy axis direction, while the short-axis direction thereof is set at a hard axis direction. A MTJ's upper insulating film 53 having a horizontally-long rectangular planar shape similar to that of the lower electrode EB3 is formed while covering the MTJ element MD3 therewith. The term "shape similar" as used herein means the shape formed by etching with the same mask as will described later and it embraces the typical process variation.

Figure 42:
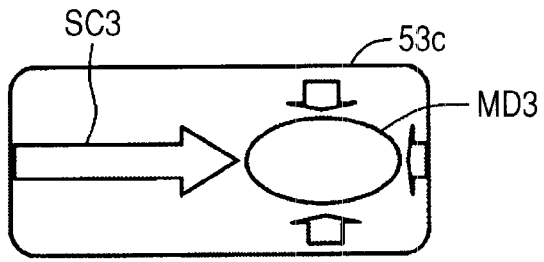
FIG. 42 is an explanatory view illustrating the planar schematic structure of the first mode in the first memory cell configuration according to Embodiment 2.

FIG. 42 is an explanatory view illustrating the planar schematic structure of the first mode in the first memory cell configuration according to Embodiment 2. As illustrated in this figure, the MTJ's upper insulating film 53 is formed as a compressive stress insulating film 53c. The compressive stress insulating film 53c applies a compressive stress SC3 to the MTJ element MD3.

Figure 43:
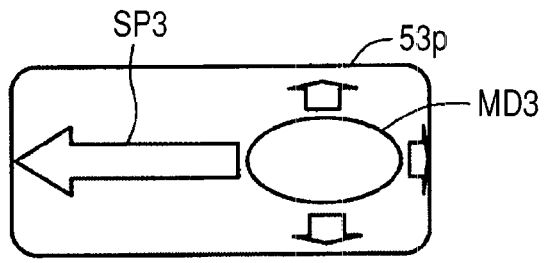
FIG. 43 is an explanatory view illustrating the planar schematic structure of the second mode in the first memory cell configuration according to Embodiment 2.

FIG. 43 is an explanatory view illustrating the planar schematic structure of the second mode in the first memory cell configuration according to Embodiment 2. As illustrated in this figure, the MTJ's upper insulating film 53 is formed as a tensile stress insulating film 53p. The tensile stress insulating film 53p applies a tensile stress SP3 to the MTJ element MD3.

Figure 44:
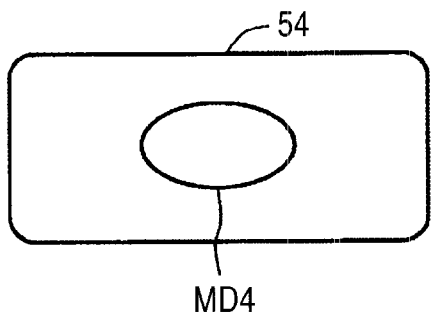
FIG. 44 is an explanatory view illustrating the planar schematic structure of a second memory cell configuration of the MRAM according to Embodiment 2 of the invention.

FIG. 44 is an explanatory view illustrating the planar schematic structure of a second memory cell configuration (STT-RAM) of the MRAM according to Embodiment 2 of the invention.

As illustrated in this figure, an MTJ element MD4 having a horizontally-long oval planar shape is formed at the center of the lower electrode EB4 having a horizontally-long rectangular planar shape. A MTJ's upper insulating film 54 having a horizontally-long rectangular planar shape similar to that of the lower electrode EB4 is then formed while covering therewith the MTJ element MD4.

Figure 45:
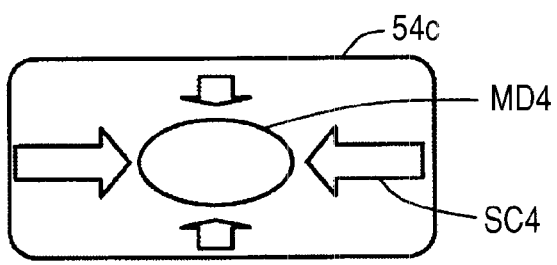
FIG. 45 is an explanatory view illustrating the planar schematic structure of the first mode in the second memory cell configuration according to Embodiment 2.

FIG. 45 is an explanatory view illustrating the planar schematic structure of the first mode in the second memory cell configuration according to Embodiment 2. As illustrated in this figure, the MTJ's upper insulating film 54 is formed as a compressive stress insulating film 54c. The compressive stress insulating film 54c applies a compressive stress SC4 to the MTJ element MD4.

Figure 46:
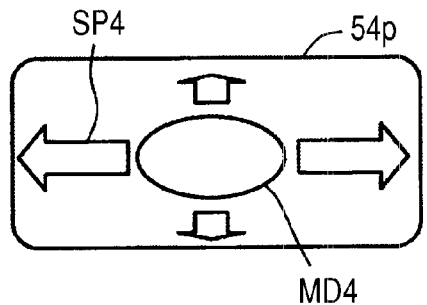
FIG. 46 is an explanatory view illustrating the planar schematic structure of the second mode in the second memory cell configuration according to Embodiment 2.

FIG. 46 is an explanatory view illustrating the planar schematic structure of the second mode in the second memory cell configuration according to Embodiment 2. As illustrated in this figure, the MTJ's upper insulating film 54 is formed as a tensile stress insulating film 54p. The tensile stress insulating film 54p applies a tensile stress SP4 to the MTJ element MD4.

As illustrated in FIGS. 42 and 45, since the MTJ's upper insulating film 53 (54) has a horizontally-long planar shape, the MTJ element MD3 (MD4) is subjected to a stronger compressive stress SC3 (SC4) in the long-side direction (long-axis direction) thereof. In the first mode, a compressive strain appears in the long side direction (which strain may hereinafter be called "compressive-direction strain").

As illustrated in FIGS. 43 and 46, the MTJ's upper insulating film 53 (54) has a horizontally-long planar shape so that the MTJ element MD3 (MD4) is subjected to a stronger tensile stress SP3 (SP4) in the long-side direction thereof. In the second mode, a tensile strain therefore appears in the long-side direction (which strain may hereinafter be called "tensile-direction strain").

Figure 47:
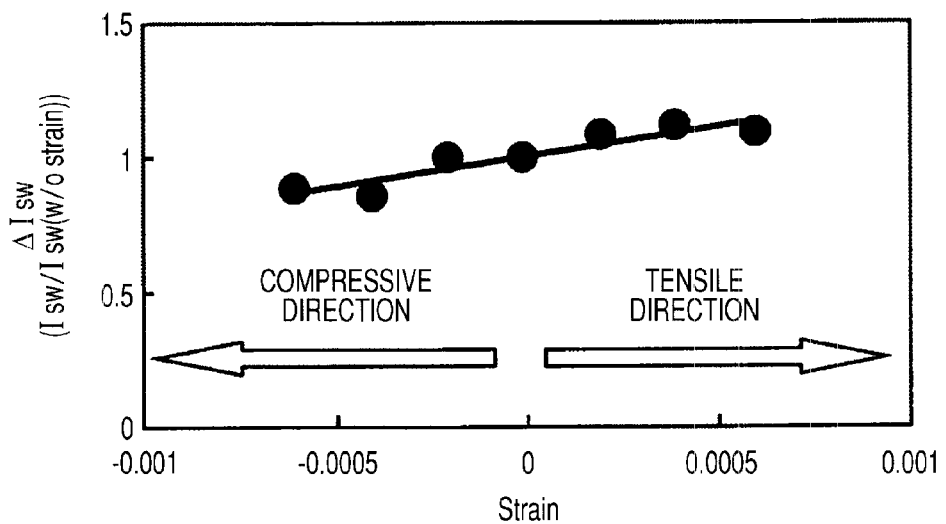
FIG. 47 is a graph showing the relationship between a strain to be applied to the long-side direction of an MTJ element in the MRAM according to Embodiment 2 and an increase/decrease of a switching current.

FIG. 47 is a graph showing the relationship between strains (compressive-direction strain and tensile-direction strain) to be applied to the long-side direction of the MTJ element having the first memory cell configuration and an increase/decrease ΔIsw of a switching current Isw in the MRAM according to Embodiment 2. The switching current change rate ΔIsw has the same meaning as that shown in FIG. 7 in Embodiment 1.

As illustrated in this figure, there is a tendency that the greater the compressive-direction strain, the greater the switching current change rate ΔIsw in a negative direction, while the greater the tensile-direction strain, the greater the switching current change rate ΔIsw in a positive direction. This means that there is a reverse relationship between Embodiment 2 and Embodiment 1 in an increase/decrease of the switching current Isw relative to the compressive-direction strain and tensile-direction strain. The above-described tendency of the first memory cell configuration also applies to the second memory cell configuration.

In the first and second memory cell configurations of the MRAM according to Embodiment 2, a uniaxial compressive stress can be effectively applied to the long-side direction of the MTJ element MD1 by employing the first mode and aligning the long-side direction of the planar shape of the MTJ's upper insulating film 33 to the long side direction of the planar shape of the MTJ element MD1.

As a result, the switching current Isw can be reduced intentionally. In other words, the memory element of the MRAM according to Embodiment 2 can intentionally shift the variation of the switching current Isw at the time of manufacture to a decreasing direction so that it is effective for suppressing an increase in the switching current Isw due to the manufacturing process variation.

In the first and second memory cell configurations of the MRAM according to Embodiment 2, a uniaxial tensile stress can be applied effectively to the long-side direction of the MTJ element MD1 by employing the second mode and aligning the long-side direction of the planar shape of the MTJ's upper insulating film 33 to the long side direction of the planar shape of the MTJ element MD1.

As a result, the switching current Isw can be increased intentionally. In other words, the memory element of the MRAM according to Embodiment 2 can shift the variation of the switching current Isw at the time of manufacture to an increasing direction so that it is effective for suppressing a reduction in the switching current Isw due to the manufacturing process variation.

The above-described effect is also produced in the MTJ element MD4 which is an MTJ element of a second kind whose resistance varies by an electric current flowing through the element itself as well as in the MTJ element MD3 which is an MTJ element of a second kind whose resistance varies depending on the magnetic field which it receives from the outside.

Since a compressive stress insulating film can usually be formed more easily, it is desired to employ Embodiment 1 in order to shift the switching current Isw in an increasing direction and to employ Embodiment 2 in order to shift the switching current Isw in a decreasing direction.

(Manufacturing Method (First Memory Cell Configuration))

Figure 48:
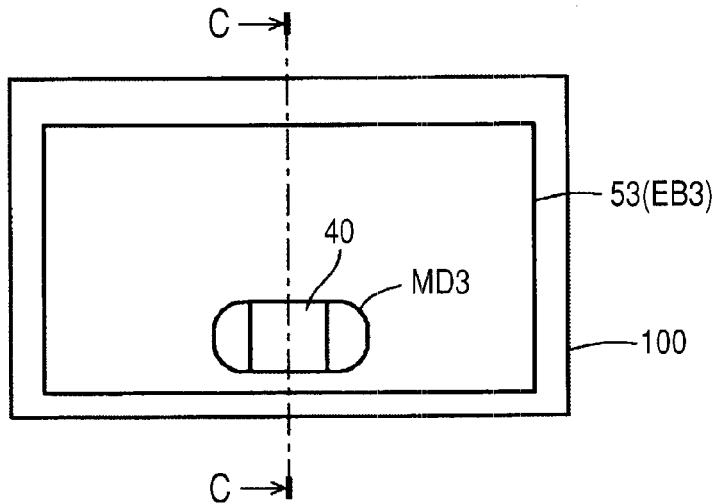
FIG. 48 is a plan view illustrating the planar structure in the first memory cell configuration according to Embodiment 2.

FIG. 48 is a plan view illustrating the planar structure in the first memory cell configuration according to Embodiment 2. As illustrated in this figure, a lower electrode EB3 having a horizontally-long rectangular planar shape is formed over the semiconductor substrate 100 and an MTJ element MD3 having a horizontally-long oval planar shape is formed on the lower center side of the lower electrode EB3. Further, an MTJ's upper insulating film 53 having a horizontally-long rectangular planar shape similar to that of the lower electrode EB3 is formed while covering therewith the MTJ element MD3. The MTJ element MD3 has, at the center thereof, a via hole 40. Although the first memory cell configuration illustrated in FIG. 48 is different from the first memory cell configuration illustrated in FIGS. 41 to 43 in the MTJ element MD3 in the MTJ's upper insulating film 53, but is similar in effect because the MTJ's upper insulating film 53 and the MTJ element MD3 are similar in their relationship in the long-side direction of the planar shape and the relationship in the short-side direction of the planar shape.

The manufacturing steps illustrated in FIGS. 9 to 28 in Embodiment 1 are also employed as the manufacturing steps of the first memory cell configuration in the MRAM of Embodiment 2. In FIGS. 9 to 28, however, the cross-section is taken along a line C-C of FIG. 48 in Embodiment 2.

(Manufacturing Method (Second Memory Cell Configuration))

Figure 49:
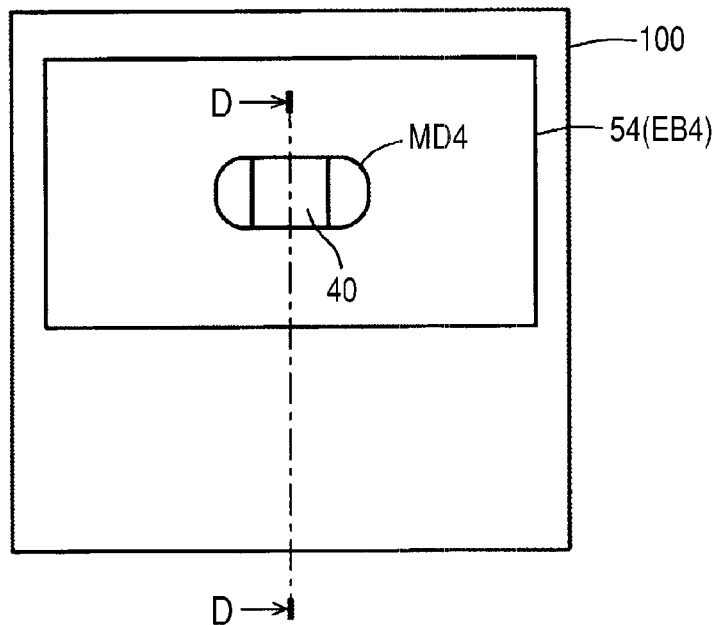
FIG. 49 is a plan view illustrating the planar structure in the second memory cell configuration according to Embodiment 2.

FIG. 49 is a plan view illustrating the planar structure of the second memory cell configuration according to Embodiment 2. As illustrated in this figure, a lower electrode EB4 having a horizontally-long rectangular planar shape is formed over the semiconductor substrate 100 and an MTJ element MD4 having a horizontally-long planar shape is formed at the center of the lower electrode EB4. Further, an MTJ's upper insulating film 54 having a horizontally-long rectangular planar shape similar to that of the lower electrode EB4 is formed while covering therewith the MTJ element MD4. The MTJ element MD4 has, at the center thereof, a via hole 40.

The manufacturing steps illustrated in FIGS. 9 to 16 and FIGS. 30 to 40 in Embodiment 1 are also employed as the manufacturing steps of the second memory cell configuration in the MRAM of Embodiment 2. In FIGS. 9 to 16 and FIGS. 30 to 40, however, the cross-section is taken along a line D-D of FIG. 49 in Embodiment 2.

EMBODIMENT 3

Principle

Figure 50:
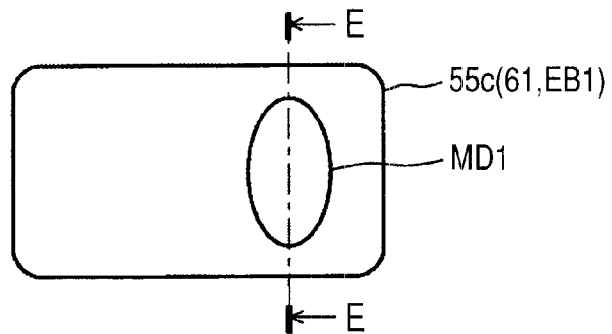
FIG. 50 is an explanatory view illustrating the planar schematic structure of the first mode in a first memory cell configuration of an MRAM according to Embodiment 3 of the invention.
Figure 51:
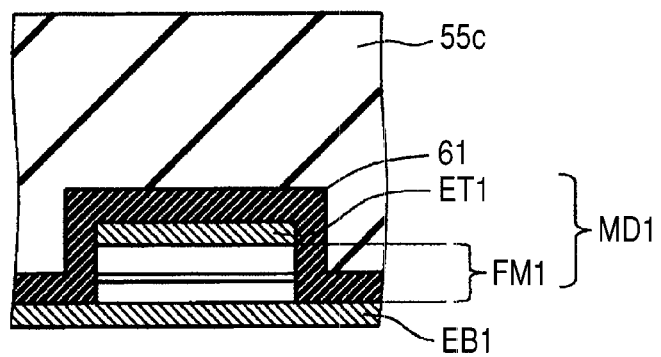
FIG. 51 is a cross-sectional view taken along a line E-E of FIG. 50.

FIG. 50 is an explanatory view illustrating the planar schematic structure of a first memory cell configuration of an MRAM (semiconductor device) according to Embodiment 3 of the invention. FIG. 51 is a cross-sectional view taken along an E-E line of FIG. 50.

As illustrated in this figure, an MTJ element MD1 having a vertically-long oval planar shape is formed on the right side of a lower electrode EB1 having a horizontally-long rectangular planar shape. The MTJ element MD1 has a stacked structure of a magnetic film FM1 and an upper electrode ET1 as illustrated in FIG. 51.

A MTJ's upper insulating film 61 having a similar planar shape to that of the lower electrode EB1 is formed while covering therewith the MTJ element MD1. A compressive stress interlayer insulating film 55c made of a material of a compressive stress insulating film over the MTJ's upper insulating film 61. The compressive stress interlayer insulating film 55c is formed over the entire surface including the MTJ element MD1 and the lower electrode EB1 and it has a film thickness exceeding that of the MTJ element MD1.

The MTJ's upper insulating film 61 is an ordinary insulating film belonging to neither a compressive stress insulating film nor a tensile stress insulating film.

Figure 52:
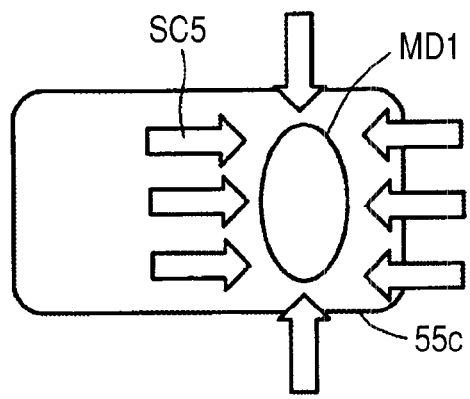
FIG. 52 is an explanatory view illustrating application of a compressive stress of the first mode in the first memory cell configuration in Embodiment 3.

FIG. 52 is an explanatory view illustrating the application of a compressive stress in the first mode in the first memory cell configuration of Embodiment 3. As illustrated in this figure, since the compressive stress interlayer insulating film 55c is formed over the entire surface with a thickness sufficiently greater than that of the MTJ element MD1, it uniformly applies a compressive stress SC5 to the MTJ element MD1. The MTJ element MD1 is thus subjected to a compressive stress SC5 (SC4) almost uniformly in both the long side direction and the short side direction.

In the first mode, the long-side portion of the planar shape of the MTJ element MD1 is subjected to a compressive stress SC5 in a wider range so that a compressive strain occurs in the short side direction (which strain may hereinafter be called "compressive-direction strain").

By employing the first mode for the first memory cell configuration of the MRAM of Embodiment 3, a switching current Isw can be increased intentionally. Described specifically, the memory element of the MRAM of Embodiment 3 can intentionally shift the variation of the switching current Isw at the time of manufacture in an increasing direction so that it is effective for suppressing a reduction in the switching current Isw due to the manufacturing process variation.

Figure 53:
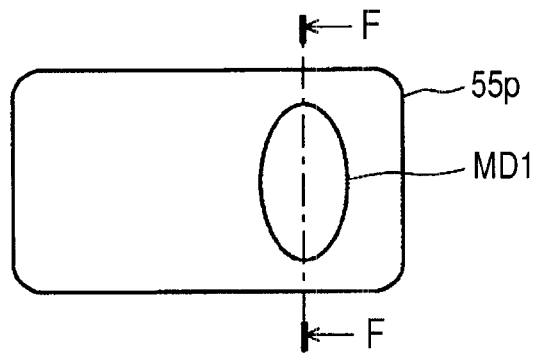
FIG. 53 is an explanatory view illustrating the planar schematic structure of the second mode in the first memory cell configuration of the MRAM according to Embodiment 3 of the invention.
Figure 54:
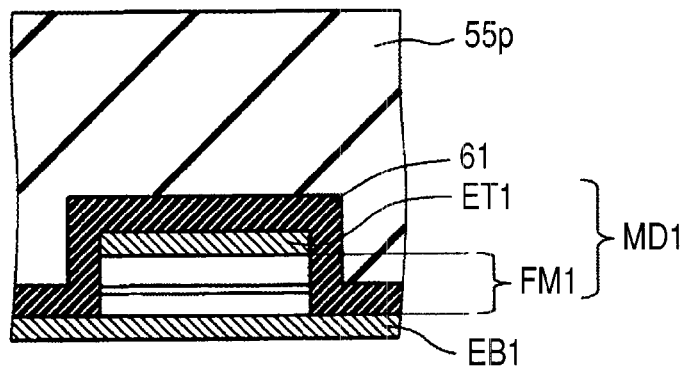
FIG. 54 is a cross-sectional view taken along a line F-F of FIG. 53.

FIG. 53 is an explanatory view illustrating the planar schematic structure of the second mode in the first memory cell configuration of MRAM according to Embodiment 3 of the invention. FIG. 54 is a cross-sectional view taken along a line F-F of FIG. 53.

As illustrated in there figures, an MTJ element MD1 having a vertically-long oval planar shape is formed on the right side of a lower electrode EB1 having a horizontally-long rectangular planar shape. The MTJ element MD1 has, as illustrated in FIG. 54, a stacked structure of a magnetic film FM1 and an upper electrode ET1.

A MTJ's upper insulating film 61 having a similar planar shape to that of the lower electrode EB1 is formed while covering therewith the MTJ element MD1. A tensile stress interlayer insulating film 55p made of a material of a tensile stress insulating film is then formed over the MTJ's upper insulating film 61. The tensile stress interlayer insulating film 55p is formed over the entire surface including the MTJ element MD1 and the lower electrode EB1. It has a thickness greater than that of the MTJ element MD1. The MTJ's upper insulating film 61 is, on the other hand, an ordinary insulating film belonging to neither a compressive stress insulating film nor a tensile stress insulating film.

Figure 55:
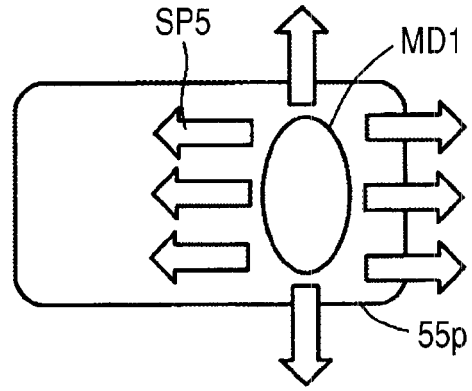
FIG. 55 is an explanatory view illustrating application of a tensile stress of the second mode in the first memory cell configuration of Embodiment 3.

FIG. 55 is an explanatory view illustrating the application of a tensile stress in the second mode in the first memory cell configuration of Embodiment 3. As illustrated in this figure, since the tensile stress interlayer insulating film 55p has a sufficiently greater thickness than that of the MTJ element MD1, the tensile stress interlayer insulating film 55p applies a tensile stress SP5 uniformly to the MTJ element MD1. Thus, the MTJ element MD1 is subjected to a tensile stress SP5 almost uniformly in both the long side direction and the short side direction thereof.

In the second mode, the long-side portion of the planar shape of the MTJ element MD1 is subjected to a tensile stress SP5 in a wider range so that a tensile strain occurs in the long side direction (which strain may hereinafter be called "tensile-direction strain").

By employing the second mode for the first memory cell configuration of the MRAM of Embodiment 3, a switching current Isw can be reduced intentionally. Described specifically, the memory element of the MRAM of Embodiment 3 can intentionally shift the variation of the switching current Isw at the time of manufacture in a decreasing direction so that it is effective for suppressing an increase in the switching current Isw due to the manufacturing process variation.

In the MRAM of Embodiment 3, a compressive stress or a tensile stress is applied to the MTJ element MD1 by means of the compressive stress interlayer insulating film 55c or the tensile stress interlayer insulating film 55p, respectively so that the device is effective for determining an increase/decrease of the switching current Isw only by the planar shape of the MTJ element MD1 irrespective of the planar shape of the lower electrode EB1 or the MTJ's upper insulating film 61.

(Manufacturing Method)

Figure 56:
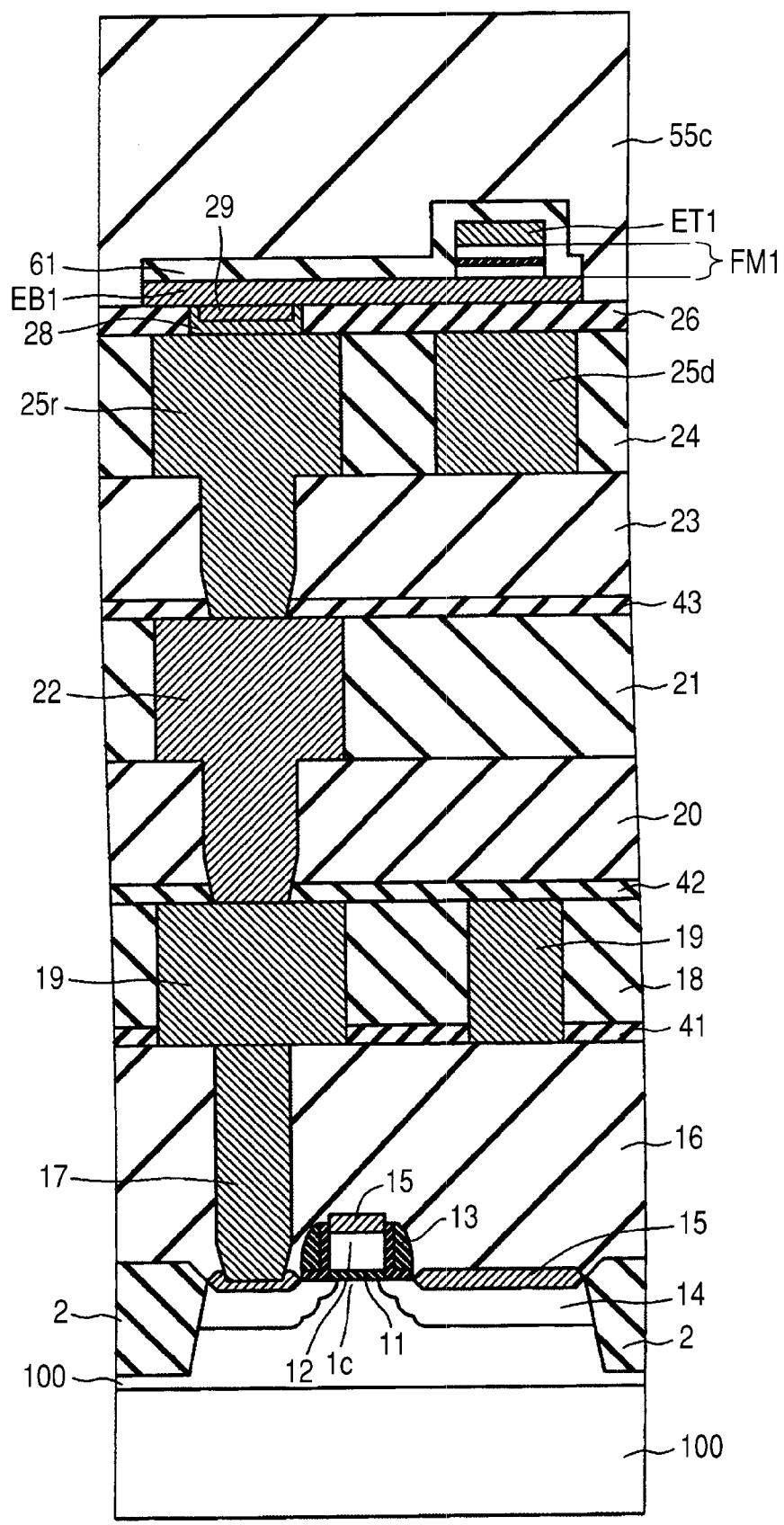
FIG. 56 is a cross-sectional view illustrating a portion of a manufacturing method of the first mode in the first memory cell configuration in the MRAM according to Embodiment 3.

FIG. 56 is a cross-sectional view illustrating a portion of the manufacturing method of the first mode of the first memory cell configuration in the MRAM according to Embodiment 3. FIG. 56 is a cross-sectional view taken along a line E-E of FIG. 53.

First, as in Embodiment 1, the first memory cell configuration of the first mode is manufactured by the steps as described in FIGS. 9 to 25. A difference from Embodiment 1 is that in Embodiment 3, an MTJ insulating film 61 belonging to neither a compressive stress insulating film nor a tensile stress insulating film is formed at the time of formation of the MTJ's upper insulating film 33.

A compressive stress interlayer insulating film 55c is then formed over the entire surface as illustrated in FIG. 56. As in Embodiment 1, the MRAM of the first mode having the first memory cell configuration according to Embodiment 3 is completed after the steps illustrated in FIGS. 27 and 28.

The first memory cell configuration of the second mode can also be formed in a similar manner except that the compressive stress interlayer insulating film 55c is replaced by a tensile stress interlayer insulating film 55p.

(Others)

In Embodiment 3, the interlayer insulating film 55 (55c, 55p) is formed via the MTJ's upper insulating film 61. Alternatively, similar effects can be attained by forming the interlayer insulating film 55 directly on the surface and the side surface of the MTJ element MD1 without forming the MTJ's upper insulating film 61.

The first memory cell is exemplified in Embodiment 3, but similar effects to those available by the first memory cell configuration can be produced by employing the first mode and the second mode similarly for the second memory cell configuration (STT-RAM) illustrated in FIGS. 4 to 6.

In Embodiment 3, the compressive stress interlayer insulating film 55c and the tensile stress interlayer insulating film 55p are formed in the memory cell configuration of Embodiment 1. Similar effects to those available by Embodiment 2 can also be obtained by forming the compressive stress interlayer insulating film 55c and the tensile stress interlayer insulating film 55p in the first or second memory cell configuration according to Embodiment 2.

<Details of Stress Insulating Film>

Details of a stress insulating film corresponding to the MTJ's upper insulating film 33 (51 to 54) or the interlayer insulating film 55 (55c, 55p) formed in Embodiments 1 to 3 will next be described.

The stress insulating film is formed as a plasma nitride film or a plasma oxide film by using plasma CVD. As will be described later, it is necessary to form the plasma nitride film or the plasma oxide film by using plasma CVD not under ordinary conditions but under special film formation conditions so as to apply a compressive stress and a tensile stress.

The plasma nitride film is excellent in that it has an oxidation suppressing function. On the other hand, the plasma oxide film is excellent in that it can reduce the interconnect capacitance because it has a lower dielectric constant than the plasma nitride film.

The special conditions for the formation of a plasma nitride film in order to obtain a desired compressive stress or a desired tensile stress will next be described by some examples. In the following examples, $SiH_4$, $NH_3$, $N_2$, and He are gases supplied into a plasma CVD apparatus.

FIRST EXAMPLE

Ultra-High Compressive Stress Nitride Film (−1.2 Gpa)

$SiH_4$: from 10 to 100 sccm, $NH_3$: from 10 to 500 sccm, $N_2$: from 1000 to 20000 sccm, pressure: from 1 to 10 Torr, temperature: from 200 to 300° C., RF power: from 10 to 100 W/from 10 to 100 W (dual frequency RF power).

SECOND EXAMPLE

Ultra-High Compressive Stress Nitride Film (w/o $NH_3$ (−1.1 Gpa)

$SiH_4$: from 10 to 100 sccm, He: from 1000 to 20000 sccm, $N_2$: from 2000 to 10000 sccm, pressure: from 1 to 10 Torr, temperature: from 200 to 300° C., RF power: from 10 to 1000 W.

THIRD EXAMPLE

High Compressive Stress Nitride Film (−0.3 Gpa)

$SiH_4$: from 10 to 500 sccm, $NH_3$: from 10 to 2000 sccm, $N_2$: from 2000 to 10000 sccm, pressure: from 1 to 10 Torr, temperature: from 200 to 300° C., RF power: from 10 to 1000 W.

FOURTH EXAMPLE

High Tensile Stress Insulating Film (0.3 Gpa)

$SiH_4$: from 10 to 100 sccm, $NH_3$: from 10 to 500 sccm, $N_2$: from 1000 to 20000 sccm, pressure: from 1 to 10 Torr, temperature: from 200 to 300° C., RF power: from 10 to 100 W.

A plasma nitride film having a compressive stress of from −0.3 Gpa but not greater than 1.2 Gpa ("−" means a compressive stress) can be obtained under the special film formation conditions shown in the first to third examples. A tensile stress film having a tensile stress of 0.3 Gpa can be obtained under the special film formation conditions shown in the fourth example.

The stress from a plasma nitride film to be used ordinarily between interconnect layers is a compressive stress and it falls within a range of from −0.2 to −0.3 GPa and does not reach 0.3 Gpa. A stress insulating film having a compressive stress is desirably a compressive stress insulating film having a compressive stress, as the absolute value, of 0.3 Gpa or greater, that is, a compressive stress greater than that of a nitride film ordinarily employed between interconnect layers as described in the above first to third examples.

As a plasma nitride film to be used between interconnect layers, a nitride film having a tensile stress is not employed, because a nitride film having a tensile stress is easily peeled and cannot be thickened. A tensile stress insulating film is therefore usable in the invention insofar as it has a tensile stress not "0". The effective tensile stress of the tensile stress insulating film is desirably 0.3 Gpa or greater, as an absolute value, similar to a compressive stress.

Data says that when a compressive stress insulating film having a compressive stress of 1 GPa is deposited on a Si substrate having a thickness of 200 nm, the wafer warps by 70 μm. In the estimation using the data, an MTJ element having a planar shape (oval: 0.24 μm (short side)×0.44 μm (long side)) in the data is presumed to show a change rate of a switching current of about 1% and thus, produce the minimum necessary effect at a compressive stress of 1 GPa.

Figure 57:
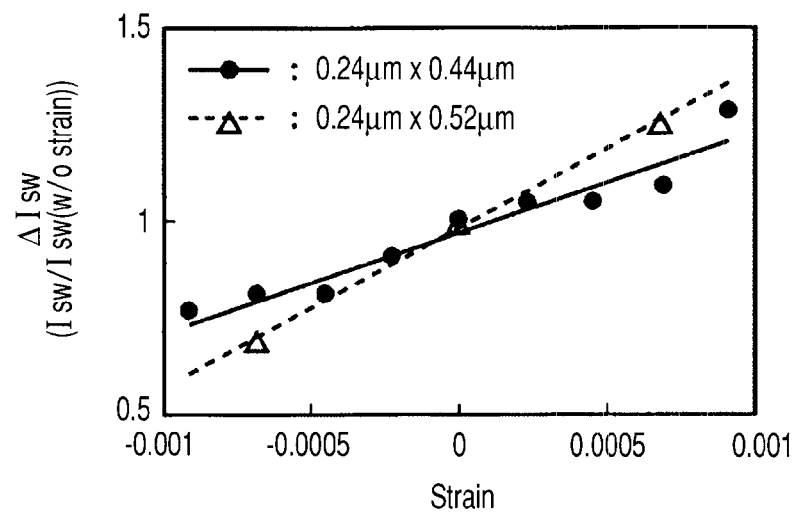
FIG. 57 is a graph showing the relationship between the mode of an MTJ element and an increase/decrease of a switching current.

FIG. 57 is a graph showing the relationship between the aspect (short side (short-axis length×long side (long-axis length)) of the MTJ element MD3 which is the first memory cell configuration according to Embodiment 2 and ΔIsw. In this graph, a solid line shows the relationship between a strain of an MTJ element MD3 (oval: 0.24 μm (short side)×0.44 μm (long side)) and ΔIsw, while a broken line shows the relationship between a strain of an MTJ element MD3 (oval: 0.24 μm×0.52 μm) and ΔIsw (in an MTJ element having a short side not greater than 0.6 μm and a long side not greater than 1 μm).

As illustrated in this graph, it is apparent that a change rate (gradient) of a switching current Isw relative to a strain increases (about two times) when the aspect of the MTJ element MD3 is large.

An increasing/decreasing effect on a switching current change rate ΔIsw produced by the application of a stress from a stress insulating film thus differs, depending on the planar shape (irrespective whether it is a symmetrical shape like oval or an asymmetrical shape) or size of the MTJ element itself. A stress insulating film having a greater thickness has a greater stress (there is a positive correlation with a strain) so that it is presumed to have a greater effect.

As described above, the degree of an increasing/decreasing effect of a switching current change rate ΔIsw in the invention cannot be determined simply by the magnitude of a compressive (tensile) stress. It is therefore desired, for producing the effect of the invention, to form a stress insulating film with a compressive stress or a tensile stress having an effective influence on the switching current change rate ΔIsw of an MTJ element in consideration of the shape or size of the MTJ element or film thickness of the stress insulating film itself.

From the above-described results of consideration, a high compressive stress insulating film having at least a compressive stress, as an absolute value, of 0.3 Gpa or greater is preferred. A high compressive stress insulating film having a compressive stress, as an absolute value, of 1.0 Gpa or greater is more preferred.

On the other hand, a tensile stress insulating film having a tensile stress of "0" or greater can be used in the invention theoretically. At a practical level, however, a high tensile stress insulating film having a tensile stress, as an absolute value, of 0.3 GPa is preferred. A high tensile stress insulating film having a tensile strength, as an absolute value, of 1.0 Gpa or greater is more preferred.

The first mode in the first and second memory cell configurations of the MRAM according to Embodiments 1 to 3 is characterized by the formation of the compressive stress insulating film (51c to 55c, 52p to 55p) capable of applying a compressive stress enough to have an effective influence on an increase/decrease of a switching current of the MTJ element.

As a result, the compressive stress insulating film thus formed can intentionally shift a switching current Isw in an increasing or decreasing direction and is therefore effective for suppressing the variation of a switching current Isw in a decreasing or increasing direction which may occur at the time of manufacture.

The second mode in the first or memory cell configuration of the MRAM according to Embodiments 1 to 3 is characterized by the formation of a tensile stress insulating film capable of applying a tensile stress. The tensile stress is preferably enough to have an effective influence on an increase/decrease of a switching current of the MTJ element.

As a result, a tensile stress insulating film thus formed can intentionally shift a switching current Isw in an increasing or decreasing direction and is therefore effective for suppressing the variation of a switching current Isw in a decreasing or increasing direction which may occur at the time of manufacture.

Either one of a compressive stress insulating film or a tensile stress insulating film has no influence on the resistance of the MTJ element.

<Others>

In Embodiments 1 to 3, described is a method of applying a stress to an MTJ element by forming an insulating film such as the MTJ's upper insulating film 33 or the compressive stress interlayer insulating film 55c for applying a compressive stress or a tensile stress. A similar effect is also available by straining a chip at the time of assembly (applying a uniaxial strain by applying a stress at the time of molding or by fixing the warpage of a chip).

The invention claimed is:

1. A semiconductor device, comprising:
a lower electrode formed over a semiconductor substrate;
an MTJ element formed over a portion of the lower electrode and having a magnetic film and an upper electrode; and
a stress insulating film which covers therewith the surface and side surface of the MTJ element and applies a stress to the MTJ element,
wherein the stress insulating film has a tensile stress insulating film which applies a tensile stress to the MTJ element,
wherein the MTJ element has a planar shape having a long side/short side ratio exceeding "1",
wherein the stress insulating film has an upper insulating film of MTJ formed directly on the surface and the side surface of the MTJ element,
wherein the upper insulating film of MTJ has a planar shape having a long side/short side ratio exceeding "1", and
wherein the long-side direction of the planar shape of the stress insulating film coincides with the short-side direction of the planar shape of the MTJ element.

2. The semiconductor device according to claim 1, wherein the stress insulating film applies a stress having an absolute value of 0.3 GPa or greater to the MTJ element.

3. The semiconductor device according to claim 1, wherein the MTJ element has an MTJ element of a first kind which undergoes a change in a resistance thereof, depending on a magnetic field externally applied to the MTJ element.

4. The semiconductor device according to claim 1, wherein the MTJ element has an MTJ element of a second kind which undergoes a change in a resistance thereof, depending on a current flowing through the MTJ element of the second kind itself.

5. A semiconductor device, comprising:
a lower electrode formed over a semiconductor substrate;
an MTJ element formed over a portion of the lower electrode and having a magnetic film and an upper electrode; and
a stress insulating film which covers therewith the surface and side surface of the MTJ element and applies a stress to the MTJ element,
wherein the stress insulating film has a tensile stress insulating film which applies a tensile stress to the MTJ element,
wherein the MTJ element has a planar shape having a long side/short side ratio exceeding "1",
wherein the stress insulating film has an upper insulating film of MTJ formed directly on the surface and the side surface of the MTJ element,
wherein the upper insulating film of MTJ has a planar shape having a long side/short side ratio exceeding "1", and
wherein the long-side direction of the planar shape of the stress insulating film coincides with the long-side direction of the planar shape of the MTJ element.

6. A semiconductor device, comprising:
a lower electrode formed over a semiconductor substrate;
an MTJ element formed over a portion of the lower electrode and having a magnetic film and an upper electrode; and
a stress insulating film which covers therewith the surface and side surface of the MTJ element and applies a stress to the MTJ element,
wherein the stress insulating film has a tensile stress insulating film which applies a tensile stress to the MTJ element,
wherein the MTJ element has a planar shape having a long-side/short side ratio exceeding "1", and
wherein the stress insulating film has a stress interlayer insulating film formed over the entire surface including the MTJ element to have a greater thickness than the thickness of the MTJ element.

7. The semiconductor device according to claim 1, wherein the stress insulating film has a plasma oxide film.

8. The semiconductor device according to claim 1, wherein the stress insulating film has a plasma nitride film.

* * * * *